United States Patent
Maeda

(10) Patent No.: US 11,139,037 B2
(45) Date of Patent: Oct. 5, 2021

(54) SEMICONDUCTOR MEMORY DEVICE INCLUDING A FIRST MEMORY CELL AND A SECOND MEMORY CELL THAT SHARE A WELL REGION

(71) Applicant: KIOXIA CORPORATION, Tokyo (JP)

(72) Inventor: Takashi Maeda, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/783,782

(22) Filed: Feb. 6, 2020

(65) Prior Publication Data

US 2020/0381067 A1 Dec. 3, 2020

(30) Foreign Application Priority Data

Jun. 3, 2019 (JP) .............................. JP2019-103667

(51) Int. Cl.
*G11C 16/34* (2006.01)
*G11C 5/06* (2006.01)
*H01L 27/11582* (2017.01)
*H01L 27/11556* (2017.01)
*G11C 16/26* (2006.01)

(52) U.S. Cl.
CPC ............ *G11C 16/3436* (2013.01); *G11C 5/06* (2013.01); *G11C 16/26* (2013.01); *H01L 27/11556* (2013.01); *H01L 27/11582* (2013.01)

(58) Field of Classification Search
CPC ....... G11C 16/3436; G11C 16/26; G11C 5/06; H01L 27/11556; H01L 27/11582
See application file for complete search history.

(56) References Cited

U.S. PATENT DOCUMENTS

| 9,230,665 | B2 | 1/2016 | Hosono |
| 9,330,775 | B2 | 5/2016 | Kim et al. |
| 9,397,110 | B2* | 7/2016 | Lue ...................... H01L 29/7926 |
| 9,424,936 | B1 | 8/2016 | Tanzawa et al. |
| 9,786,375 | B2 | 10/2017 | Goda et al. |
| 9,852,803 | B2 | 12/2017 | Diep et al. |
| 9,940,232 | B1 | 4/2018 | Kim et al. |
| 9,984,754 | B2* | 5/2018 | Sakamoto .......... G11C 16/0483 |
| 10,199,116 | B2* | 2/2019 | Shim ...................... G11C 16/10 |

(Continued)

FOREIGN PATENT DOCUMENTS

| JP | 2012069224 A | 4/2012 |
| JP | 2012160236 A | 8/2012 |

(Continued)

*Primary Examiner* — Vanthu T Nguyen
(74) *Attorney, Agent, or Firm* — Holtz, Holtz & Volek PC

(57) ABSTRACT

According to one embodiment, a semiconductor memory device includes: a first memory cell and a second memory cell capable of storing data and coupled in parallel to a bit line; a first word line coupled to the first memory cell; a second word line coupled to the second memory cell and being different from the first word line; and a control circuit. The first memory cell and the second memory cell share a first well region and are opposed to each other, with the first well region interposed. The control circuit is configured, in a first operation, to repeat application of a first voltage to the first word line and the second word line a plurality of times while increasing the first voltage.

11 Claims, 28 Drawing Sheets

(56) References Cited

U.S. PATENT DOCUMENTS

| | | | |
|---|---|---|---|
| 10,269,828 B2 * | 4/2019 | Futatsuyama | H01L 27/11565 |
| 10,340,013 B2 | 7/2019 | Futayama et al. | |
| 10,672,478 B2 * | 6/2020 | Shirakawa | G11C 16/0483 |
| 10,811,105 B2 * | 10/2020 | Futatsuyama | H01L 27/1157 |
| 2013/0141971 A1 | 6/2013 | Hosono | |
| 2016/0268277 A1 | 9/2016 | Nagashima | |
| 2017/0330632 A1 | 11/2017 | Shim et al. | |

FOREIGN PATENT DOCUMENTS

| | | | |
|---|---|---|---|
| JP | 2017168163 A | 9/2017 |
| JP | 6280369 B2 | 1/2018 |
| JP | 2018511138 A | 4/2018 |

* cited by examiner

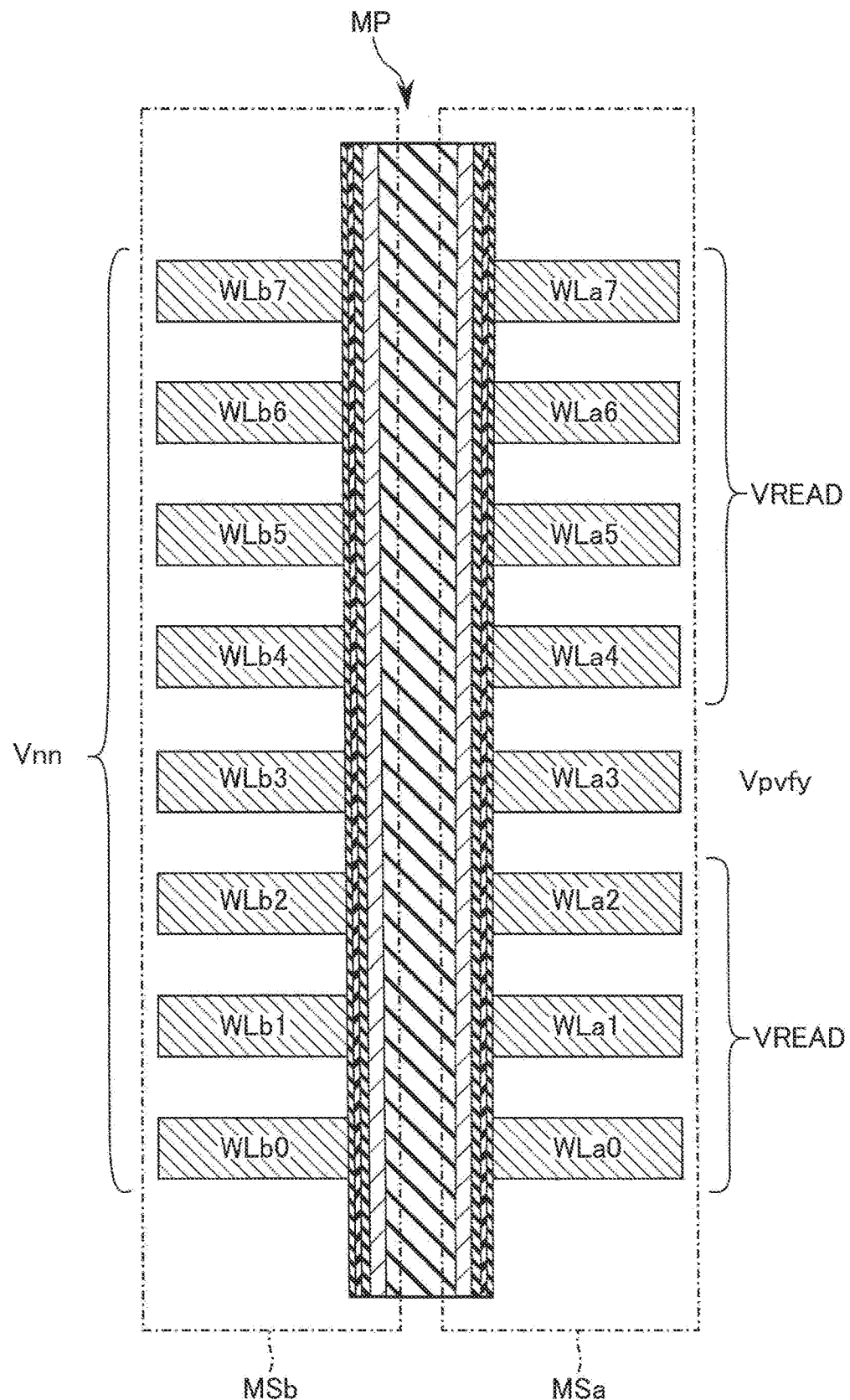
F I G. 11

|     | SU0  |      | SU1  |      | SU2  |      | SU3  |      |
| --- | ---- | ---- | ---- | ---- | ---- | ---- | ---- | ---- |
|     | SSUa | SSUb | SSUb | SSUa | SSUa | SSUb | SSUb | SSUa |
| L7  | 57   | 58   | 59   | 60   | 61   | 62   | 63   | 64   |
| L6  | 49   | 50   | 51   | 52   | 53   | 54   | 55   | 56   |
| L5  | 41   | 42   | 43   | 44   | 45   | 46   | 47   | 48   |
| L4  | 33   | 34   | 35   | 36   | 37   | 38   | 39   | 40   |
| L3  | 25   | 26   | 27   | 28   | 29   | 30   | 31   | 32   |
| L2  | 17   | 18   | 19   | 20   | 21   | 22   | 23   | 24   |
| L1  | 9    | 10   | 11   | 12   | 13   | 14   | 15   | 16   |
| L0  | 1    | 2    | 3    | 4    | 5    | 6    | 7    | 8    |

※ Erase operation is assumed to be "0"-th operation

FIG. 15

|   |   | SU0 | | SU1 | | SU2 | | SU3 | |
|---|---|---|---|---|---|---|---|---|---|
|   |   | SSUa | SSUb | SSUb | SSUa | SSUa | SSUb | SSUb | SSUa |
| L7 | NW | 57 | 58 | 59 | 60 | 61 | 62 | 63 | 64 |
|    | EW | 0-29 | | 0-30 | | 0-31 | | 0-32 | |
| L6 | NW | 49 | 50 | 51 | 52 | 53 | 54 | 55 | 56 |
|    | EW | 0-25 | | 0-26 | | 0-27 | | 0-28 | |
| L5 | NW | 41 | 42 | 43 | 44 | 45 | 46 | 47 | 48 |
|    | EW | 0-21 | | 0-22 | | 0-23 | | 0-24 | |
| L4 | NW | 33 | 34 | 35 | 36 | 37 | 38 | 39 | 40 |
|    | EW | 0-17 | | 0-18 | | 0-19 | | 0-20 | |
| L3 | NW | 25 | 26 | 27 | 28 | 29 | 30 | 31 | 32 |
|    | EW | 0-13 | | 0-14 | | 0-15 | | 0-16 | |
| L2 | NW | 17 | 18 | 19 | 20 | 21 | 22 | 23 | 24 |
|    | EW | 0-9 | | 0-10 | | 0-11 | | 0-12 | |
| L1 | NW | 9 | 10 | 11 | 12 | 13 | 14 | 15 | 16 |
|    | EW | 0-5 | | 0-6 | | 0-7 | | 0-8 | |
| L0 | NW | 1 | 2 | 3 | 4 | 5 | 6 | 7 | 8 |
|    | EW | 0-1 | | 0-2 | | 0-3 | | 0-4 | |

※ Erase operation is assumed to be "0-0"-th operation

F I G. 17

|  | | SU0 | | SU1 | | SU2 | | SU3 | |
|---|---|---|---|---|---|---|---|---|---|
|  |  | SSUa | SSUb | SSUb | SSUa | SSUa | SSUb | SSUb | SSUa |
| L7 | NW | 57 | 58 | 59 | 60 | 61 | 62 | 63 | 64 |
|  | EW | 56-1 | | | 56-2 | 56-3 | | | 56-4 |
| L6 | NW | 49 | 50 | 51 | 52 | 53 | 54 | 55 | 56-0 |
|  | EW | 48-1 | | | 48-2 | 48-3 | | | 48-4 |
| L5 | NW | 41 | 42 | 43 | 44 | 45 | 46 | 47 | 48-0 |
|  | EW | 40-1 | | | 40-2 | 40-3 | | | 40-4 |
| L4 | NW | 33 | 34 | 35 | 36 | 37 | 38 | 39 | 40-0 |
|  | EW | 32-1 | | | 32-2 | 32-3 | | | 32-4 |
| L3 | NW | 25 | 26 | 27 | 28 | 29 | 30 | 31 | 32-0 |
|  | EW | 24-1 | | | 24-2 | 24-3 | | | 24-4 |
| L2 | NW | 17 | 18 | 19 | 20 | 21 | 22 | 23 | 24-0 |
|  | EW | 16-1 | | | 16-2 | 16-3 | | | 16-4 |
| L1 | NW | 9 | 10 | 11 | 12 | 13 | 14 | 15 | 16-0 |
|  | EW | 8-1 | | | 8-2 | 8-3 | | | 8-4 |
| L0 | NW | 1 | 2 | 3 | 4 | 5 | 6 | 7 | 8-0 |
|  | EW | 0-1 | | | 0-2 | 0-3 | | | 0-4 |

※ Erase operation is assumed to be "0-0"-th operation

F I G. 19

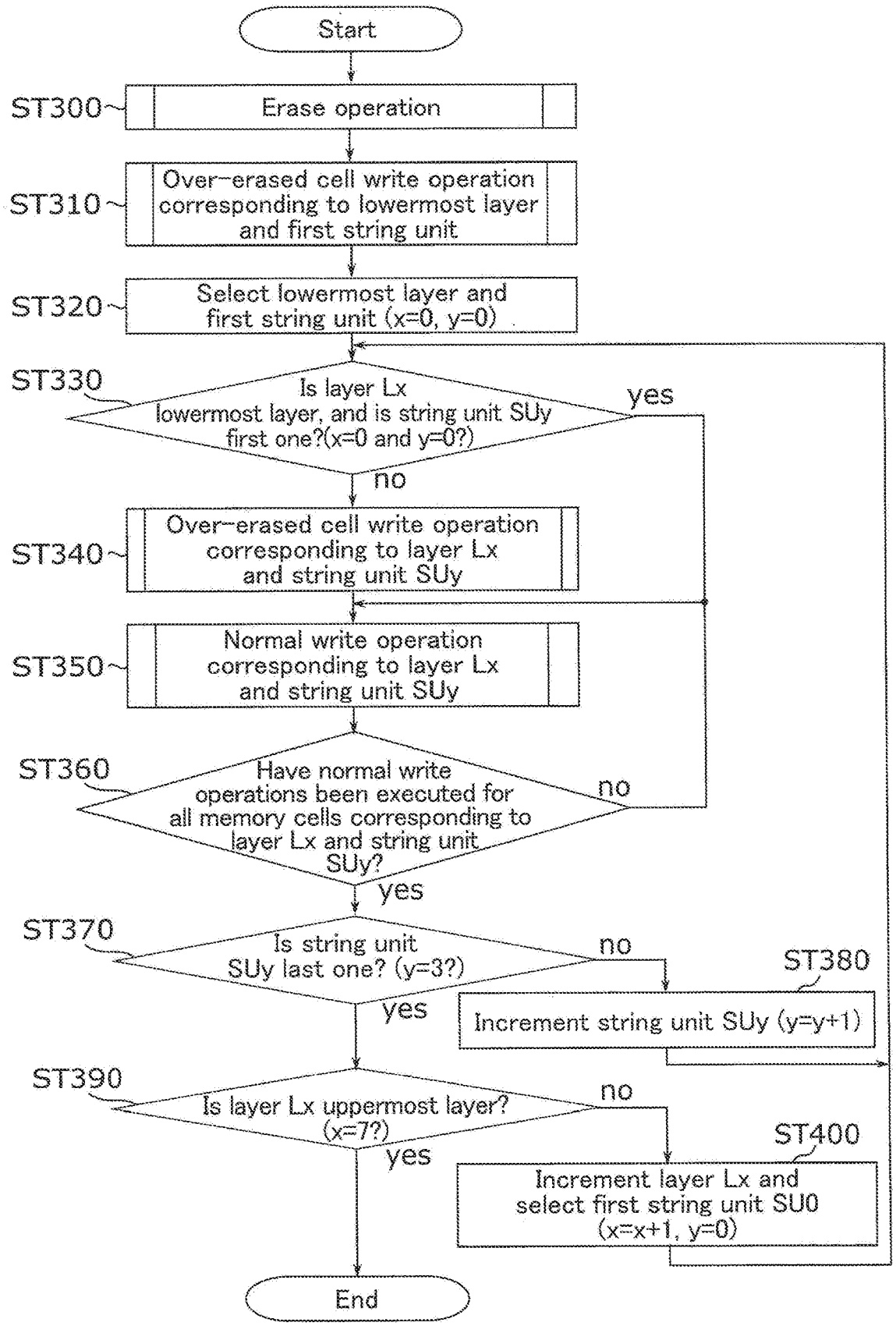
F I G. 20

|    |    | SU0 | | SU1 | | SU2 | | SU3 | |
|----|----|-----|-----|-----|-----|-----|-----|-----|-----|
|    |    | SSUa | SSUb | SSUa | SSUb | SSUa | SSUb | SSUa | SSUb |
| L7 | NW | 57 | 58-0 | 59 | 60-0 | 61 | 62-0 | 63 | 64 |
|    | EW | 56-1 | | 58-1 | | 60-1 | | 62-1 | |
| L6 | NW | 49 | 50-0 | 51 | 52-0 | 53 | 54-0 | 55 | 56-0 |
|    | EW | 48-1 | | 50-1 | | 52-1 | | 54-1 | |
| L5 | NW | 41 | 42-0 | 43 | 44-0 | 45 | 46-0 | 47 | 48-0 |
|    | EW | 40-1 | | 42-1 | | 44-1 | | 46-1 | |
| L4 | NW | 33 | 34-0 | 35 | 36-0 | 37 | 38-0 | 39 | 40-0 |
|    | EW | 32-1 | | 34-1 | | 36-1 | | 38-1 | |
| L3 | NW | 25 | 26-0 | 27 | 28-0 | 29 | 30-0 | 31 | 32-0 |
|    | EW | 24-1 | | 26-1 | | 28-1 | | 30-1 | |
| L2 | NW | 17 | 18-0 | 19 | 20-0 | 21 | 22-0 | 23 | 24-0 |
|    | EW | 16-1 | | 18-1 | | 20-1 | | 22-1 | |
| L1 | NW | 9 | 10-0 | 11 | 12-0 | 13 | 14-0 | 15 | 16-0 |
|    | EW | 8-1 | | 10-1 | | 12-1 | | 14-1 | |
| L0 | NW | 1 | 2-0 | 3 | 4-0 | 5 | 6-0 | 7 | 8-0 |
|    | EW | 0-1 | | 2-1 | | 4-1 | | 6-1 | |

※ Erase operation is assumed to be "0-0"-th operation

FIG. 21

|  | | SU0 | | SU1 | | SU2 | | SU3 | |
|---|---|---|---|---|---|---|---|---|---|
|  | | SSUa | SSUb | SSUa | SSUb | SSUa | SSUb | SSUa | SSUb |
| L7 | NW | 57 | 58 | 59 | 60 | 61 | 62 | 63 | 64 |
|  | EW | 48-1 | | 48-2 | | 48-3 | | 48-4 | |
| L6 | NW | 49 | 50 | 51 | 52 | 53 | 54 | 55 | 56-0 |
|  | EW | 40-1 | | 40-2 | | 40-3 | | 40-4 | |
| L5 | NW | 41 | 42 | 43 | 44 | 45 | 46 | 47 | 48-0 |
|  | EW | 32-1 | | 32-2 | | 32-3 | | 32-4 | |
| L4 | NW | 33 | 34 | 35 | 36 | 37 | 38 | 39 | 40-0 |
|  | EW | 24-1 | | 24-2 | | 24-3 | | 24-4 | |
| L3 | NW | 25 | 26 | 27 | 28 | 29 | 30 | 31 | 32-0 |
|  | EW | 16-1 | | 16-2 | | 16-3 | | 16-4 | |
| L2 | NW | 17 | 18 | 19 | 20 | 21 | 22 | 23 | 24-0 |
|  | EW | 8-1 | | 8-2 | | 8-3 | | 8-4 | |
| L1 | NW | 9 | 10 | 11 | 12 | 13 | 14 | 15 | 16-0 |
|  | EW | 0-5 | | 0-6 | | 0-7 | | 0-8 | |
| L0 | NW | 1 | 2 | 3 | 4 | 5 | 6 | 7 | 8-0 |
|  | EW | 0-1 | | 0-2 | | 0-3 | | 0-4 | |

※Erase operation is assumed to be "0-0"-th operation

F I G. 23

| | | SU0 | | SU1 | | SU2 | | SU3 | |
|---|---|---|---|---|---|---|---|---|---|
| | | SSUa | SSUb | SSUb | SSUa | SSUa | SSUb | SSUb | SSUa |
| L7 | NW | 57 | 58-0 | 59 | 60-0 | 61 | 62-0 | 63 | 64 |
| | EW | 48-1 | | 50-1 | | 52-1 | | 54-1 | |
| L6 | NW | 49 | 50-0 | 51 | 52-0 | 53 | 54-0 | 55 | 56-0 |
| | EW | 40-1 | | 42-1 | | 44-1 | | 46-1 | |
| L5 | NW | 41 | 42-0 | 43 | 44-0 | 45 | 46-0 | 47 | 48-0 |
| | EW | 32-1 | | 34-1 | | 36-1 | | 38-1 | |
| L4 | NW | 33 | 34-0 | 35 | 36-0 | 37 | 38-0 | 39 | 40-0 |
| | EW | 24-1 | | 26-1 | | 28-1 | | 30-1 | |
| L3 | NW | 25 | 26-0 | 27 | 28-0 | 29 | 30-0 | 31 | 32-0 |
| | EW | 16-1 | | 18-1 | | 20-1 | | 22-1 | |
| L2 | NW | 17 | 18-0 | 19 | 20-0 | 21 | 22-0 | 23 | 24-0 |
| | EW | 8-1 | | 10-1 | | 12-1 | | 14-1 | |
| L1 | NW | 9 | 10-0 | 11 | 12-0 | 13 | 14-0 | 15 | 16-0 |
| | EW | 0-5 | | 2-1 | | 4-1 | | 6-1 | |
| L0 | NW | 1 | 2-0 | 3 | 4-0 | 5 | 6-0 | 7 | 8-0 |
| | EW | 0-1 | | 0-2 | | 0-3 | | 0-4 | |

※Erase operation is assumed to be "0-0"-th operation

FIG. 25

|   |    | SU0 | | SU1 | | SU2 | | SU3 | |
|---|----|-----|-----|-----|-----|-----|-----|-----|-----|
|   |    | SSUa | SSUb | SSUb | SSUa | SSUa | SSUb | SSUb | SSUa |
| L7 | NW | 57 | 58 | 59 | 60 | 61 | 62 | 63 | 64 |
|    | EW | | | | | 0-8 | | | |
| L6 | NW | 49 | 50 | 51 | 52 | 53 | 54 | 55 | 56 |
|    | EW | | | | | 0-7 | | | |
| L5 | NW | 41 | 42 | 43 | 44 | 45 | 46 | 47 | 48 |
|    | EW | | | | | 0-6 | | | |
| L4 | NW | 33 | 34 | 35 | 36 | 37 | 38 | 39 | 40 |
|    | EW | | | | | 0-5 | | | |
| L3 | NW | 25 | 26 | 27 | 28 | 29 | 30 | 31 | 32 |
|    | EW | | | | | 0-4 | | | |
| L2 | NW | 17 | 18 | 19 | 20 | 21 | 22 | 23 | 24 |
|    | EW | | | | | 0-3 | | | |
| L1 | NW | 9 | 10 | 11 | 12 | 13 | 14 | 15 | 16 |
|    | EW | | | | | 0-2 | | | |
| L0 | NW | 1 | 2 | 3 | 4 | 5 | 6 | 7 | 8 |
|    | EW | | | | | 0-1 | | | |

※ Erase operation is assumed to be "0-0"-th operation

F I G. 26

| | | SU0 | | SU1 | | SU2 | | SU3 | |
|---|---|---|---|---|---|---|---|---|---|
| | | SSUa | SSUb | SSUb | SSUa | SSUa | SSUb | SSUb | SSUa |
| L7 | NW | 57 | 58 | 59 | 60 | 61 | 62 | 63 | 64 |
| | EW | | | | 56-1 | | | | 56-0 |
| L6 | NW | 49 | 50 | 51 | 52 | 53 | 54 | 55 | 56-0 |
| | EW | | | | 48-1 | | | | 48-0 |
| L5 | NW | 41 | 42 | 43 | 44 | 45 | 46 | 47 | 48-0 |
| | EW | | | | 40-1 | | | | 40-0 |
| L4 | NW | 33 | 34 | 35 | 36 | 37 | 38 | 39 | 40-0 |
| | EW | | | | 32-1 | | | | 32-0 |
| L3 | NW | 25 | 26 | 27 | 28 | 29 | 30 | 31 | 32-0 |
| | EW | | | | 24-1 | | | | 24-0 |
| L2 | NW | 17 | 18 | 19 | 20 | 21 | 22 | 23 | 24-0 |
| | EW | | | | 16-1 | | | | 16-0 |
| L1 | NW | 9 | 10 | 11 | 12 | 13 | 14 | 15 | 16-0 |
| | EW | | | | 8-1 | | | | 8-0 |
| L0 | NW | 1 | 2 | 3 | 4 | 5 | 6 | 7 | 8-0 |
| | EW | | | | 0-1 | | | | 0-0 |

※ Erase operation is assumed to be "0-0"-th operation

F I G. 27

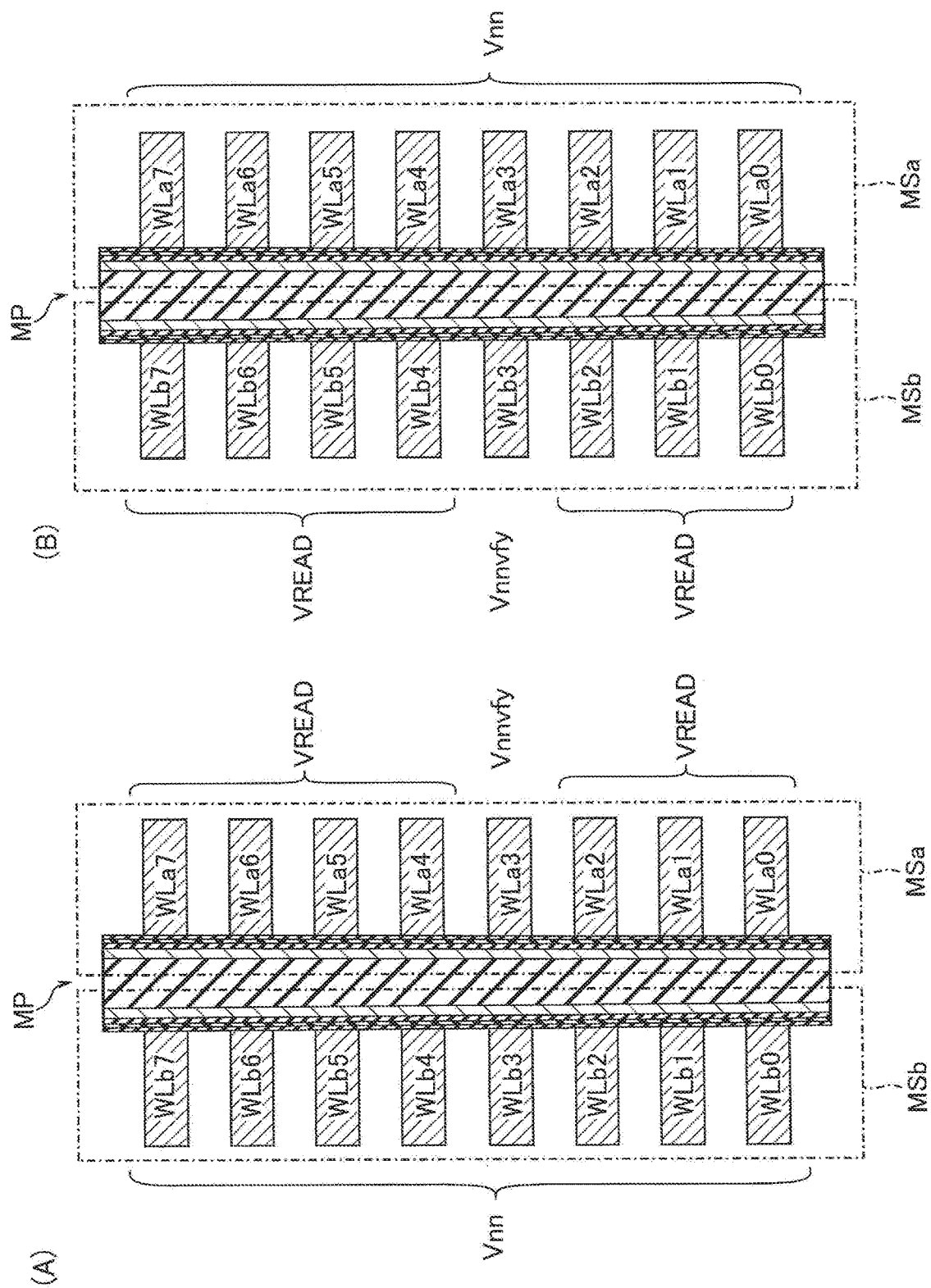
F I G. 28

US 11,139,037 B2

SEMICONDUCTOR MEMORY DEVICE INCLUDING A FIRST MEMORY CELL AND A SECOND MEMORY CELL THAT SHARE A WELL REGION

CROSS-REFERENCE TO RELATED APPLICATIONS

This application is based upon and claims the benefit of priority from Japanese Patent Application No. 2019-103667, filed Jun. 3, 2019, the entire contents of which are incorporated herein by reference.

FIELD

Embodiments described herein relate generally to a semiconductor memory device.

BACKGROUND

A NAND flash memory is known as a semiconductor memory device capable of storing data in a nonvolatile manner.

BRIEF DESCRIPTION OF THE DRAWINGS

FIG. 11 is a schematic diagram for illustrating a program operation of the normal write operation in the semiconductor memory device according to the first embodiment.

FIG. 15 is a conceptual diagram for illustrating an order in which normal write operations are executed for a block of a semiconductor memory device according to a second embodiment.

FIG. 17 is a conceptual diagram for illustrating the order in which the over-erased cell write operation and the normal write operation are executed for the block of the semiconductor memory device according to the second embodiment.

FIG. 19 is a conceptual diagram for illustrating the order in which the over-erased cell write operation and the normal write operation are executed for the block of the semiconductor memory device according to the third embodiment.

FIG. 20 is a flowchart for illustrating an order in which an over-erased cell write operation and a normal write operation are executed for a block of a semiconductor memory device according to a fourth embodiment.

FIG. 21 is a conceptual diagram for illustrating the order in which the over-erased cell write operation and the normal write operation are executed for the block of the semiconductor memory device according to the fourth embodiment.

FIG. 23 is a conceptual diagram for illustrating the order in which the over-erased cell write operation and the normal write operation are executed for the block of the semiconductor memory device according to the first modification applied to the third embodiment.

FIG. 25 is a conceptual diagram for illustrating the order in which the over-erased cell write operation and the normal write operation are executed for the block of the semiconductor memory device according to the first modification applied to the fourth embodiment.

FIG. 26 is a conceptual diagram for illustrating an order in which an over-erased cell write operation and a normal write operation are executed for a block of a semiconductor memory device according to a second modification applied to the second embodiment.

FIG. 27 is a conceptual diagram for illustrating an order in which an over-erased cell write operation and a normal write operation are executed for a block of a semiconductor memory device according to the second modification applied to the third embodiment.

FIG. 28 is a schematic diagram for illustrating an over-erased cell verify operation in a semiconductor memory device according to a third modification.

DETAILED DESCRIPTION

In general, according to one embodiment, a semiconductor memory device includes: a semiconductor memory device includes: a first memory cell and a second memory cell capable of storing data and coupled in parallel to a bit line; a first word line coupled to the first memory cell; a second word line coupled to the second memory cell and being different from the first word line; and a control circuit. The first memory cell and the second memory cell share a first well region and are opposed to each other, with the first well region interposed. The control circuit is configured, in a first operation, to repeat application of a first voltage to the first word line and the second word line a plurality of times while increasing the first voltage.

Hereinafter, embodiments will foe described with reference to the accompanying drawings. The drawings are schematic or conceptual, and the dimensions and scales of the drawings are not necessarily the same as actual products. The technical concept underlying the present invention is not limited by the shapes, structures, arrangements, etc. of the components.

In the description below, structural elements having the same functions and configurations will be denoted by the same reference symbols. The numbers after the letters of reference symbols are referred to by reference symbols containing the same letters and are used to distinguish between elements having similar configurations. Where elements denoted by reference symbols including the same reference symbols need net be discriminated from each other, they will be denoted by reference symbols including only letters.

1. First Embodiment

A semiconductor memory device according to a first embodiment will be described. In the description below, reference will be made to a case where the semiconductor memory device is realised as a memory system including a WAND flash memory.

1-1 Configuration

The configuration of a memory system according to the present embodiment will be described.

1.1.1 Overall Configuration

First, an overall configuration of the memory system according to the present embodiment will be described with reference to FIG. 1.

Figure 1:
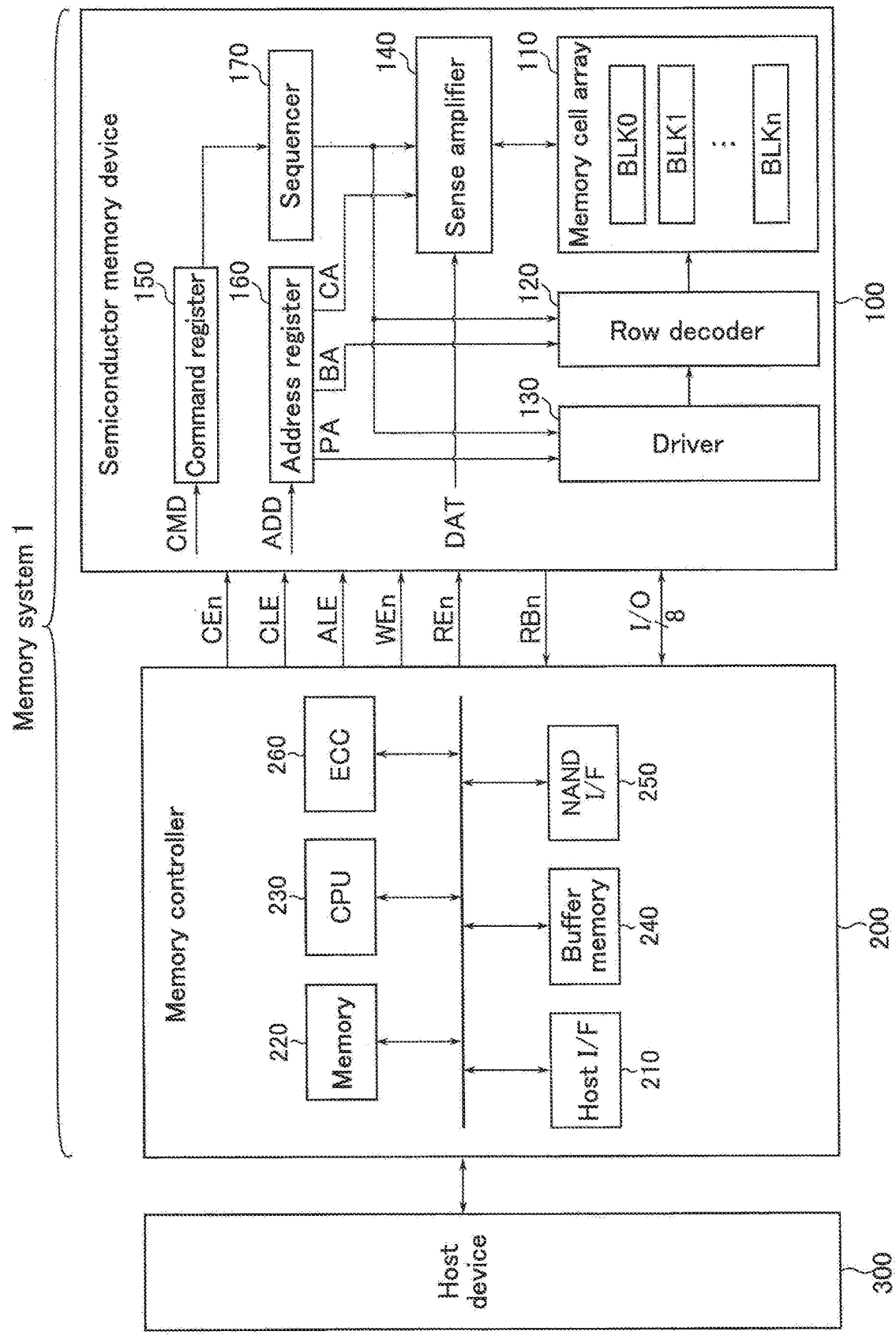
FIG. 1 is a block diagram showing a memory system including a semiconductor memory device according to a first embodiment.

As shown in FIG. 1, the memory system 1 includes a semiconductor memory device (NAND flash memory) 100 and a memory controller 200. The NAND flash memory 100 and the memory controller 200 may constitute one semiconductor device, for example, by combining them together. Examples of such a semiconductor device are a memory card such as an SD™ card, and a solid state drive (SSD). The memory controller 200 may be a system on chip (SoC), for example.

The NAND flash memory 100 includes a plurality of memory cells and stores data in a nonvolatile manner. The memory controller 200 is coupled to the NAND flash memory 100 through a NAND bus, and is coupled to a host device 300 through a host bus. The memory controller 200 controls the NAND flash memory 100 and accesses the NAND flash memory 100 in response to an instruction received from the host device 300. The host device 300 may be, for example, a digital camera, a personal computer or the like, and the host bus may be, for example, a bus compatible with the SD™ interface. The NAND bus is a bus through which signals compatible with the NAND interface are exchanged.

1.1.2 Configuration of Memory Controller

The detailed configuration of the memory controller 200 will be described with reference to FIG. 1. As shown in FIG. 1, the memory controller 200 includes a host interface circuit 210, a memory (RAM) 220, a processor (CPU) 230, a buffer memory 240, a NAND interface circuit 250, and an ECC (Error Check and Correction) circuit 260.

The host interface circuit 210 is coupled to the host device 300 through the host bus, and transfers instructions and data received from the host device 300 to the processor 230 and the buffer memory 240. The host interface circuit 210 also transfers data in the buffer memory 240 to the host device 300 in response to instructions from the processor 230.

The processor 230 controls the overall operation of the memory controller 200. If a write instruction is received from the host device 300, for example, the processor 230 issues a write command to the NAND interface circuit 250 in response to the received instruction. Similar operations are executed in read and erase operations. The processor 230 also executes various kinds of operations such as wear leveling to manage the NAND flash memory 100. The operations of the memory controller 200 described below may be realized by the execution of software (firmware) by the processor 230, or may be realized by hardware.

The NAND interface circuit 250 is coupled to the NAND flash memory 100 through the NAND bus, and performs communications with the NAND flash memory 100. Based on instructions received from the processor 230, the NAND interface circuit 250 transmits various signals to the NAND flash memory 100 and receives various signals from the NAND flash memory 100.

The buffer memory 240 temporarily stores write data or read data.

The memory 220 is, for example, a semiconductor memory such as a DRAM or an SRAM, and is used as the work space of the processor 230. The memory 220 stores firmware for managing the NAND flash memory 100 and various kinds of management tables.

The ECC circuit 260 performs error detection and error correction operations for data stored in the NAND flash memory 100. That is, at the time of data write, the ECC circuit 260 generates an error correction code and adds it to the write data. At the time of data read, the ECC circuit 260 decodes the code.

1.1.3 Configuration of NAND Flash Memory

Next, a description will be given of the configuration of the NAND flash memory 100. As shown in RIG. 1, the NAND flash memory 100 includes a memory cell array 110, a row decoder 120, a driver 130, a sense amplifier 140, a command register 150, an address register 160, and a sequencer 170.

The memory cell array 110 includes a plurality of blocks BLK each including a plurality of nonvolatile memory cells associated with rows and columns. The memory cell array 110 stores data provided by the memory controller 200.

The row decoder 120 selects one of the blocks BLK, and further selects a row direction of the selected block BLK.

The driver 130 applies voltages to the selected block BLK through the row decoder 120.

At the time of data read operation and data verify operation, the sense amplifier 140 senses the threshold voltage of memory cell transistors in the memory cell array 110 and reads data. The sense amplifier 140 outputs this read data DAT to the memory controller 200. At the time of data write operation, the sense amplifier 140 transfers the write data DAT received from the memory controller 200 to the memory cell array 110.

The command register 150 stores commands CMD received from the memory controller 200. The address register 160 stores addresses ADD received from the memory controller 200. The addresses ADD include, for example, a block address BA, a page address DA, and a column address CA. For example, the block address BA, the page address PA and the column address CA are used to select a block BLK, a word line and a bit line, respectively.

The sequencer 170 controls the overall operation of the NAND flash memory 100 based on various information stored in the command register 150 and the address register 160.

1.1.4 Configuration of Memory Cell Array

Next, a configuration of the memory cell array 110 according to the present embodiment will be described.

1.1.4.1 Circuit Configuration

Figure 2:
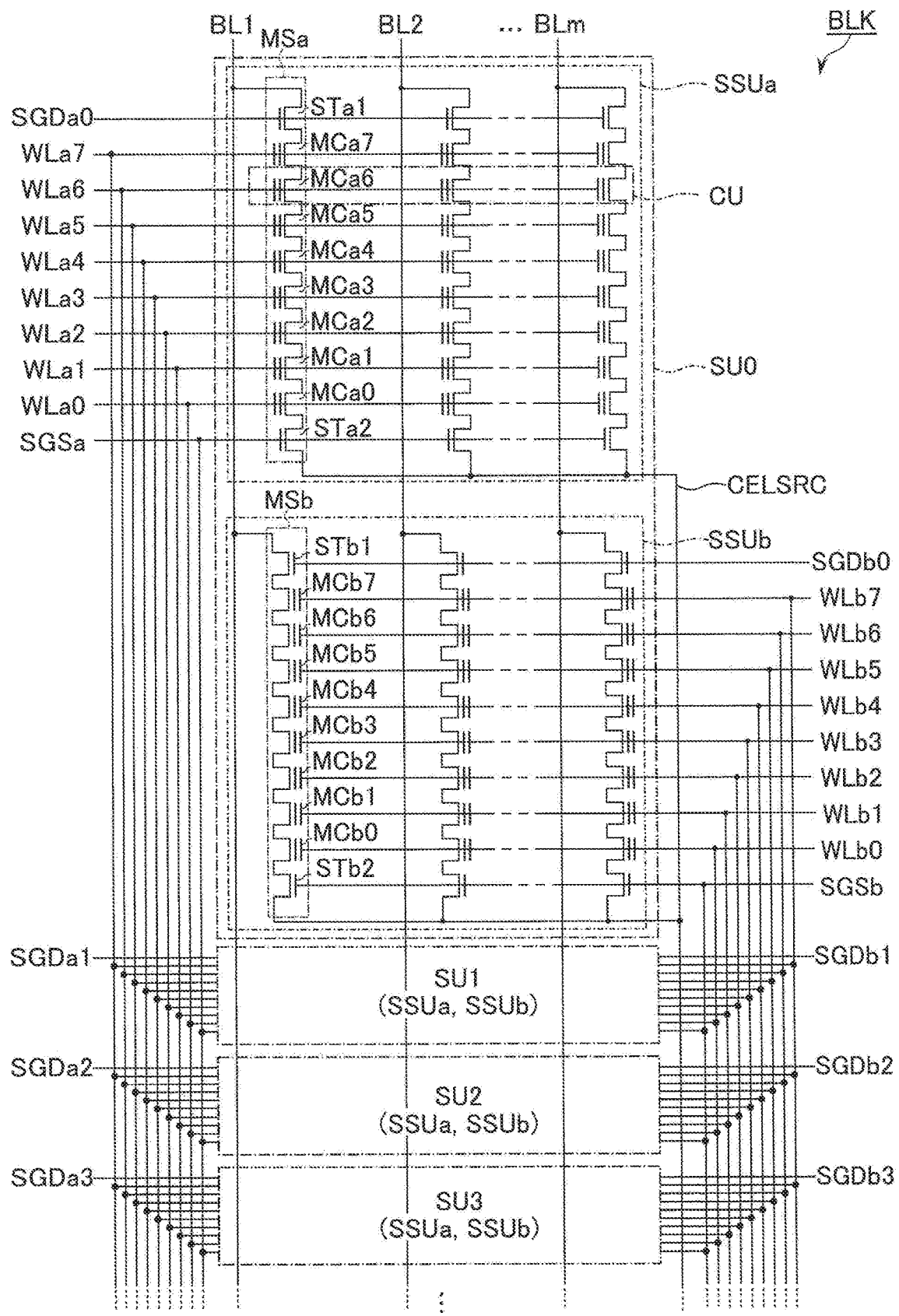
FIG. 2 is a circuit diagram showing a memory cell array of the semiconductor memory device according to the first embodiment.

First, a circuit configuration of the memory coll array 110 will be described with reference to FIG. 2. FIG. 2 is an equivalent circuit diagram of block BLK. As shown in FIG.2, block BLK includes, for example, four string units SU (SU0, SU1, SV2 and SU3). Each of the string units SU includes, for example, two substring units SSU (SSUa and SSUb). Each of the substring units SSU includes a plurality of memory strings MS. Hereinafter, where the memory string MS cf substring unit SSUa and the memory string MS of substring unit SSUb are distinguished from each other, they will be referred to as memory strings MSa and MSb, respectively. With regard to the other configurations, interconnects, etc., where necessary, subscript "a" is added to elements corresponding to substring unit SSUa, and subscript "b" is added to elements corresponding to the substring unit SSUb.

Each of the memory strings MS includes, for example, eight memory cell transistors MC (MC0 to MC7) and select transistors ST1 and ST2. Each of the memory cell transistors MC includes a control gate and a charge storage layer, and stores data in a nonvolatile manner. The memory cell transistors MC are coupled in series between the source of select transistor ST1 and the drain of select transistor ST2.

The gates of select transistors STa1 included in each of substring units SSUa of the string units SU0 to SU3 are coupled to select gate lines SGDa (SGDa0 to SGDa3), respectively. The gates of select transistors STb1 included in each of substring units SSUb of the string units SU0 to SU3 are coupled to select gate lines SGDb (SGDb0 to SGDb3), respectively. The select gate lines SGDa0 to SGDa3 and SGDb0 to SGDb3 are independently controlled by the row decoder 120.

The gates of select transistors STa2 included in the substring units SSUa of the same block BLK are commonly coupled to, for example, select gate line SGSa, and the gates of select transistors STb2 included in the substring units SSUb of the same block BLK are commonly coupled to, for example, select gate line SGSb. Select gate lines SGSa and SGSb may be coupled in common, for example, or may be independently controllable.

The control gates of the memory cell transistors MCa (MCa0 to MCa7) included in substring units SSUa of the same block BLK are commonly coupled to word lines WLa (WLa0 to WLa7), respectively. On the other hand, the control gates of the memory cell transistors MCb (MCb0 to MCb7) included in substring units SSUb are commonly coupled to the word lines WLb (WLb0 to WLb7), respectively, word lines WLa and WLb are independently controlled by the row decoder 120.

The block BLK is, for example, a unit of data erase. That is, data stored in the memory cell transistors MC included in the same block BLK are erased collectively.

The drains of the select transistors ST1 of the memory strings MS of the same column in the memory cell array 110 are commonly coupled to a bit line BL (BL1 to BLm, m: a natural number of 2 or more), That is, the bit line BL commonly couples a set of memory strings MSa and MSb of each of the string units SU. The sources of select transistors ST2 are commonly coupled to a source line CELSRC.

That is, the substring unit SSU is an aggregation of a plurality of memory strings MS that are coupled to different bit lines BL and are coupled to the same select gate line SGD. An aggregation of memory cell transistors MC included in the substring unit SSU and commonly coupled to the same word line WL is also referred to as a cell unit CU. The block BLK is an aggregation of a plurality of substring units SSU that share a plurality of word lines WL. The memory cell array 110 is an aggregation of a plurality of blocks BLK that share a plurality of bit lines BL.

In the memory cell array 110, select gate lines SGS, word lines WL and select gate line SGD are stacked above the semiconductor substrate, whereby the memory cell transistors MC and select transistors ST1 and ST2 are stacked in three dimensions.

1.1.4.2 Planar Layout

Figure 3:
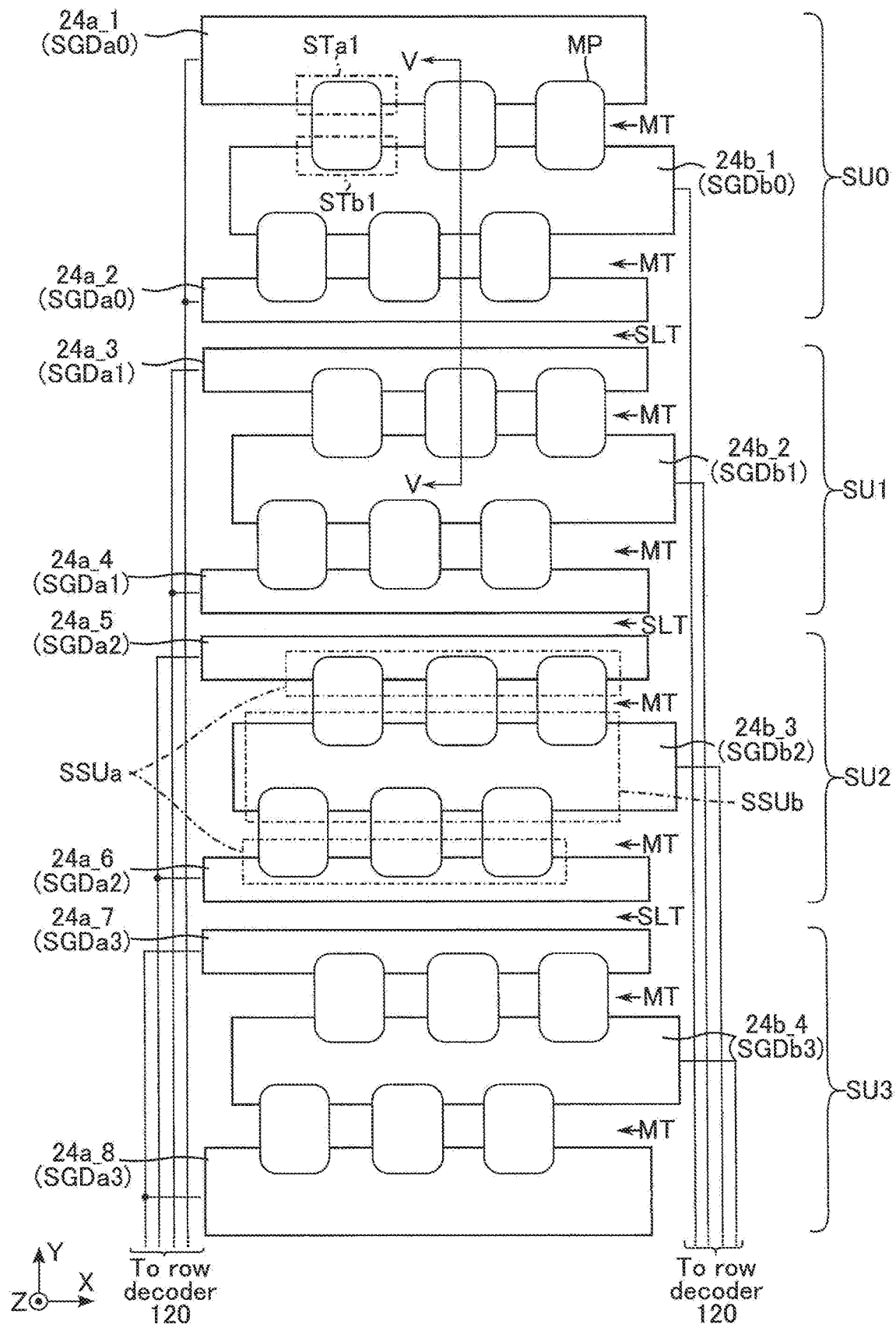
FIG. 3 is a top view of select gate lines of the memory cell array of the semiconductor memory device according to the first embodiment.
Figure 4:
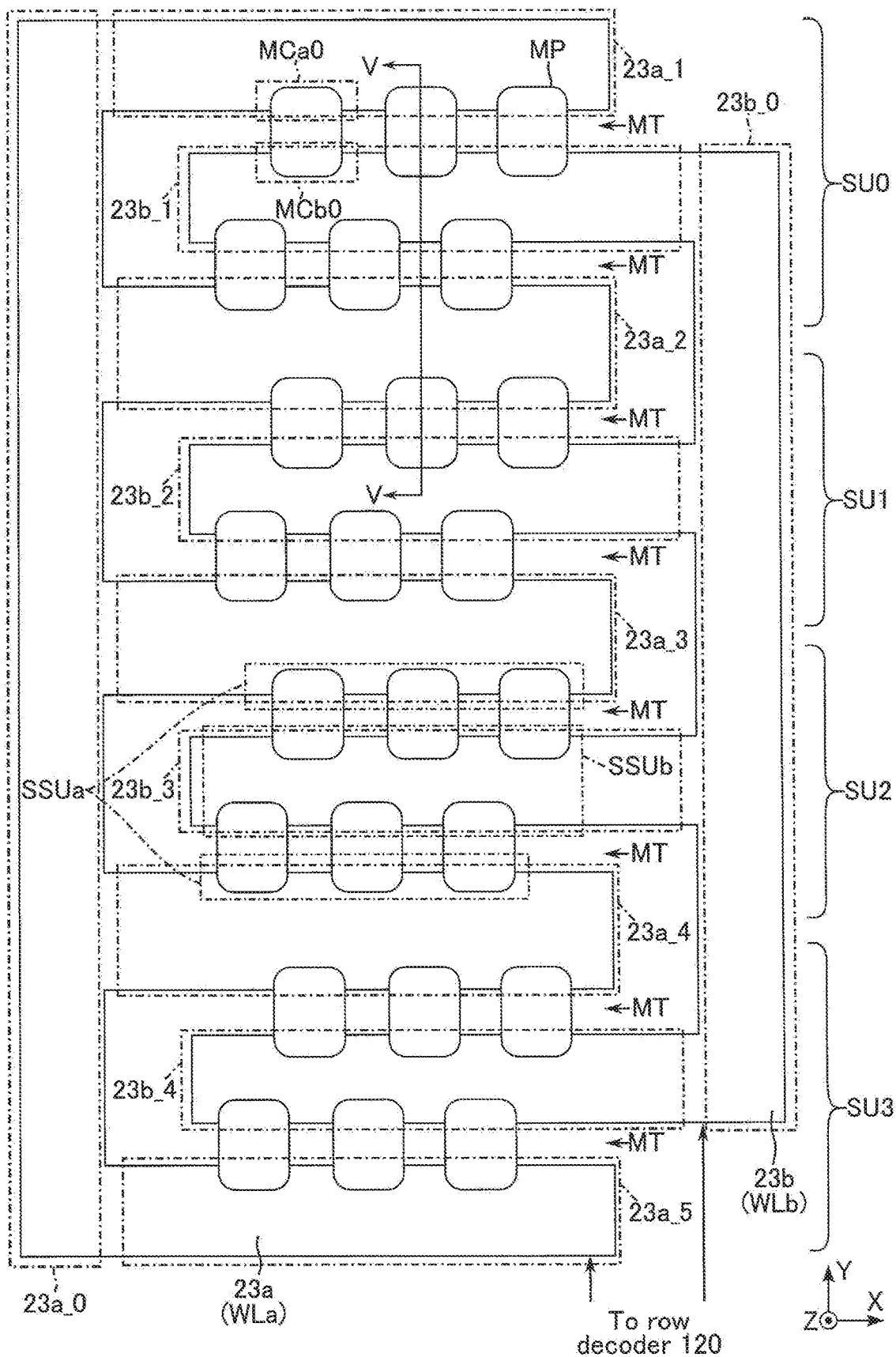
FIG. 4 is a top view of word lines of the memory cell array of the semiconductor memory device according to the first embodiment.

Next, an example of a planar layout of the memory cell array 110 will be described with reference to FIGS. 3 and 4. The example in FIG. 3 shows a planar layout of select gate lines SGD (SGDa0 to SGDa3 and SGDb0 to SGDb3) of the block BLK0 including four string units SU0 to SU3. The example in FIG. 4 shews a planar layout, of word lines WLa and WLb of the block BLK0. In the example in FIGS. 3 and 4, illustration of insulating films is omitted for convenience of description.

In the description set forth below, a plane along the semiconductor substrate will be referred to as an XY plane, and the X axis and the Y axis intersect each other in the XY plane. The select gate lines SGD extend along the X axis, and the bit lines BL extend along the Y axis. An axis perpendicular to the XY plane will be referred to as a Z axis, and a direction in which various materials are stacked on the semiconductor substrate will be referred to as an upward direction or a stacking direction. For example, the X axis and the Y axis are perpendicular to each other, and an XYZ system is represented by a right hand system.

As shown in FIG. 3, twelve conductive layers 24a_1, 24b_1, 24a_2, 24a_3, 24b_2, 24a_4, 24a_5, 24b_3, 24a_6, 24a_7, 24b_4 and 24a_6 extending along the X axis are arranged in order along the Y axis. Conductive layers 24a and 24b function as select gate lines SGDa and SGDb, respectively. In the example shown in FIG. 3, in the block BLK, two conductive layers 24a_1 and 24a_2 function as select gate line SGDa0 and are commonly coupled to the row decoder 120. Conductive layers 24a_3 and 24a_4 function as select gate line SGDa1 and are commonly coupled to the row decoder 120, Conductive layers 24a_5 and 24a_6 function as select gate line SGDa2 and are commonly coupled to the row decoder 120. Conductive layers 24a_7 and 24a_8 function as select gate line SGDa3 and are commonly coupled to the row decoder 120. Conductive layers 24b_1 to 24b_4 function as select gate lines SGDb0 to SGDb3, respectively, and are individually coupled to the row decoder 120. Hereinafter, if conductive layers 24a (24a_1 to 24a_8) and conductive layers 24b (24b_1 to 24b_4) do not have to be discriminated from each other, they will be referred to as conductive layers 24 as well.

The twelve conductive layers 24 that are adjacent along the Y axis in the block BLK are separated from each other by an insulating film (not shown). A region of an insulating layer provided between conductive layer 24a and conductive layer 24b will be referred to as a memory trench MT. More specifically, the memory trench MT is provided between conductive layers 24a_1 and 24b_1, between conductive layers 24b_1 and 24a_2, between conductive layers 24a_3 and 24b_2, between conductive layers 24b_2 and 24a_4, between conductive layers 24a_5 and 24b_3, between conductive layers 24b_3 and 24a_6, between conductive layers 24a_7 and 24b_4, and between conductive layers 24b_4 and 24a_8. Similarly to the select gate lines SGD, a plurality of word lines WL (not shown) and a plurality of select gate lines SGS (not shown) that are provided below the select gate lines SGD are also separated along the Y axis by the memory trenches MT.

A region of the insulating layer provided between two conductive layers 24a and extending along the X axis will be referred to as a slit SLT. More specifically, the slit SLT is provided between conductive layers 24a_2 and 24a_3, between conductive layers 24a_4 and 24a_5, and between conductive layers 24a_6 and 24a_7. The slit SLT separates select gate lines SOD along the Y axis, but does not separate word lines VJL or select gate line SGS that are provided below.

In the region which is between conductive layers 24a and 24b and in which the memory trench MT is provided, a plurality of memory pillars MP each extending along the Z axis are arranged in, for example, a staggered arrangement. One memory pillar MP corresponds to a set of one memory string MSa and one memory string MSb.

For example, in memory pillar MP provided between select gate line SGDa0 (conductive layer 24a_1) and select gate line SGDb0 (conductive layer 24b_1), a region that includes part of select gate line SGDa0 and part of memory pillar MP in contact with select gate line SGDa0 functions as select transistor STa1 of substring unit SSUa of string unit SU0. Similarly, a region that includes part of select gate line SGDb0 and part of the memory pillar MP in contact with select gate line SGDb0 functions as select transistor STb1 of string unit SU0.

Next, a planar layout of word, lines WLa0 and WLb0 will be described. Word lines WLa0 and WLb0 are provided below the select gate lines SGD along the Z axis.

As shown in FIG. 4, conductive layer 23a functioning as word line WLa and conductive layer 23b functioning as word line WLb are individually coupled to the row decoder 120. Conductive layer 23a includes a conductive layer 23a_0 extending along the Y axis and five conductive layers 23a_1 to 23a_5 extending along the X axis. Conductive layer 23b includes a conductive layer 23b_0 extending along the Y axis and four conductive layers 23b_1 to 23b_4 extending along the X axis. Hereinafter, if conductive layers 23a and 23b do not have to be discriminated from each other, they will be referred to as conductive layers 23.

In the region between conductive layer 23a_0 and the conductive layer 23b_0, conductive layers 23a_1, 23b_1, 23a_2, 23b_2, 23a_3, 23b_3, 23a_4, 23b_4 and 23a_5 are sequentially arranged along the Y axis. The first ends of conductive layers 23a_1 to 23a_5 are coupled to conductive layer 23a_0, and the first ends of conductive layers 23b_1 to 23b_4 are copuled to conductive layer 23b_0. The second ends of conductive layers 23a_1 to 23a_5 are separated from conductive layer 23b_0 by an insulating film (not shown), and the second ends of conductive layers 23b_1 to 23b_4 are separated from conductive layer 23a_0 by an insulating film (not shown).

Conductive layer 23a_1 is arranged below conductive layer 24a_1. Conductive layer 23b_1 is arranged below conductive layer 24b_1. Conductive layer 23a_2 is arranged below conductive layer 24a_2 and conductive layer 24a_3. Conductive layer 23b_2 is arranged below conductive layer 24b_2. Conductive layer 23a_3 is arranged below conductive layer 24a_4 and conductive layer 24a_5. Conductive layer 23b_3 is arranged below conductive layer 24b_3. Conductive layer 23a_4 is arranged below conductive layer 24a_6 and conductive layer 24a_7. Conductive layer 23b_4 is arranged below conductive layer 24b_4. Conductive layer 23a_5 is arranged below conductive layer 24a_8.

As described above, the portions of word line WLa and word line WLb that, adjacent along the Y axis are separated from each other by memory trenches MT. A plurality of memory pillars MP described with reference to FIG. 3 are arranged between word line WLa and word line WLb.

In memory pillar MP provided between word line WLa and word line WLb, a region that includes part of word line WLa and part of memory pillar MP in contact with word line WLa functions as memory cell transistor MCa0; in other words, the region functions as one memory cell. Similarly, a region that includes part of word line WLb corresponding to the memory pillar MP mentioned above and part, of memory pillar MP in contact with word line WLb functions as memory cell transsistor MCb. Two memory cell transistors MC corresponding to one memory pillar MP are provided in the same layer.

1.1.4.3 Sectional Configuration

Figure 5:
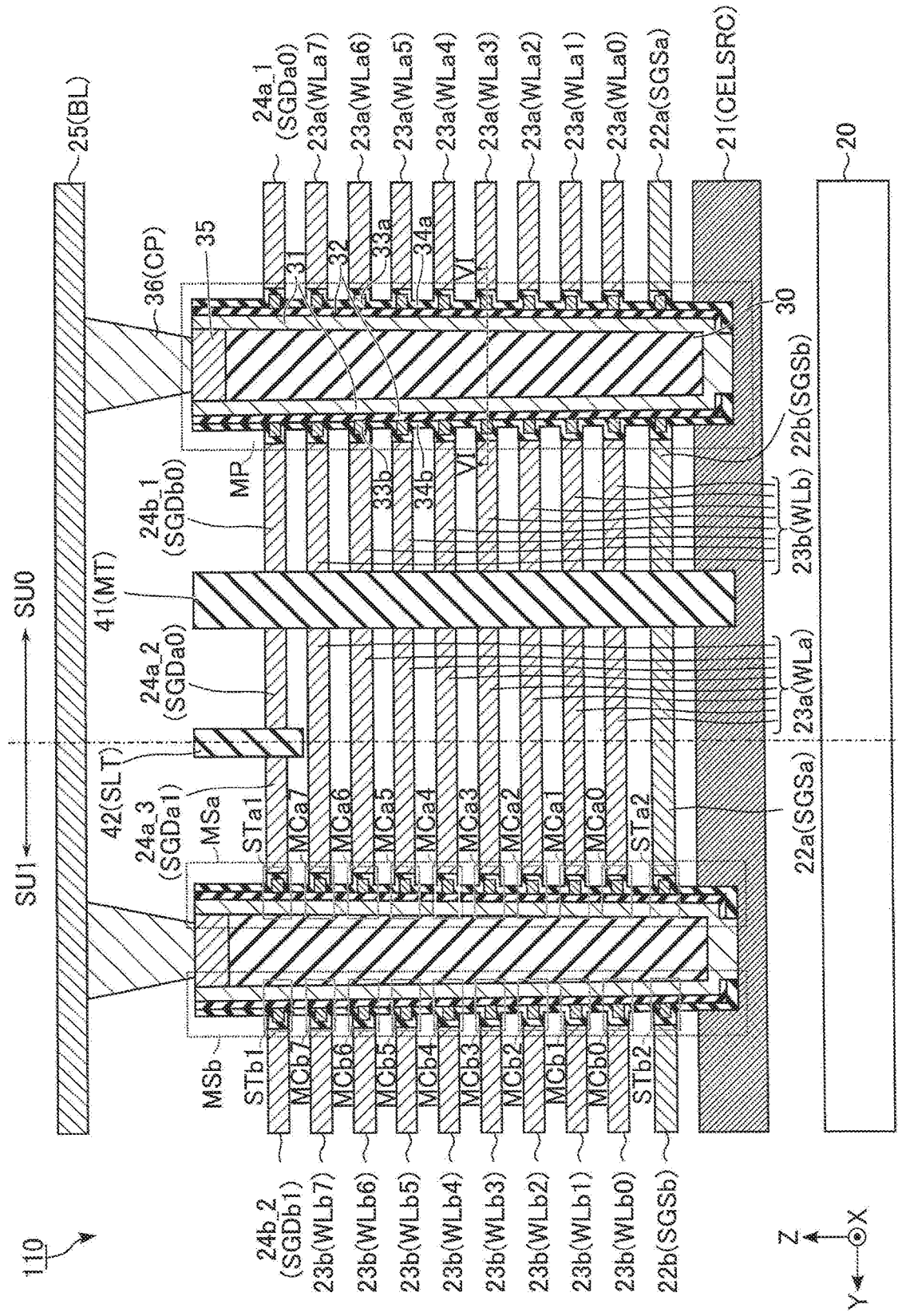
FIG. 5 is a sectional view of the memory cell array taken along line V-V shown in FIGS. 3 and 4.
Figure 6:
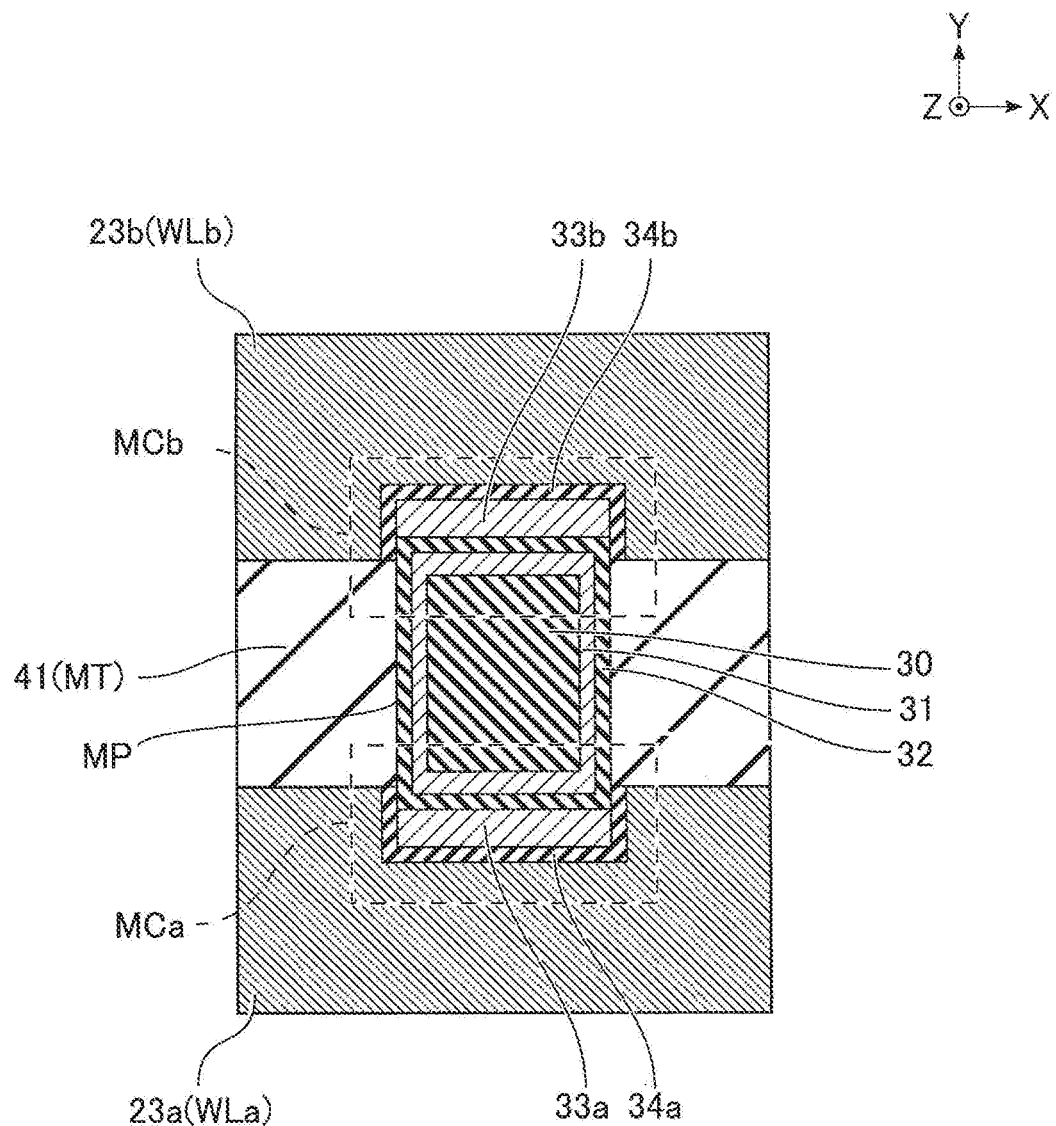
FIG. 6 is a sectional view of a memory pillar taken along line VI-VI shown in FIG. 5.

Next, a sectional configuration of the memory cell array 110 will be described with reference to FIG. 5 and FIG. 6. The example shown in FIG. 5 is a sectional view of the memory cell array 110 taken along line V-V in FIGs. 3 and 4. The example shown in FIG. 6 is a sectional view taken along line VI-VI in FIG. 5. In FIG. 5, for convenience of description, illustration of stacked insulating films is omitted as appropriate.

First, with reference to FIG. 5, the configuration in the section along the YZ plane of the memory pillar MP will be described. In FIG. 5, the configuration includes two memory pillars MP arranged along the Y axis and respectively included in string units SU0 and SU1, and memory trench MT and slit SLT that are provided between the two memory pillars MP.

As shown in FIG. 5, conductive layer 21 that functions as source line CBLSRC is provided above the semiconductor substrate 20. Conductive layer 21 is made of a conductive material, and is, for example, an n-type semiconductor doped with impurities or a metal material. For example, conductive layer 21 may have a stacked structure of a semiconductor layer and a metal layer. Circuits such as the row decoder 120 and the sense amplifier 140 may be provided between the semiconductor substrate 20 and conductive layer 21.

Above conductive layer 21, conductive layer 22 functioning as select gate line SGS, eight conductive layers 23 functioning as word lines WL0 to WL7, and conductive layer 24 functioning as select gate line SGD are sequentially stacked such that the conductive layers are separated from each other along the Z axis, with a plurality of insulating layers interposed.

Conductive layers 22 to 24 are made of a conductive material, and are made of, for example, an n-type semiconductor or p-type semiconductor doped with impurities, or a metal material. For example, conductive layers 22-24 employ a stacked structure of titanium nitride (TiN)/tungsten (W). Titanium nitride (TIN) functions as a barrier layer for preventing the reaction between tungsten (W) and silicon oxide ($SiO_2$) when tungsten (W) is formed by CVD (chemical vapor deposition). Alternatively, titanium nitride functions as an adhesion layer for improving the adhesion with tungsten (W).

Conductive layer 25 is provided above conductive layer 24, with an insulating layer (not shown) interposed. Conductive layer 25 extends along the Y axis. A plurality of conductive layers 25, which are like lines, are arranged along the X axis, and each of them is used as bit line BL. Conductive layers 25 contain, for example, copper (Cu).

Insulating layer 41 extends along the X axis in string unit SU, passes through conductive layers 22 to 24, and the bottom surface thereof is in contact with conductive layer 21. That is, Insulating layer 41 functions as a memory trench MT that divides conductive layers 22 to 24 into conductive layers 22a to 24a and conductive layers 22b to 24b. Insulating layer 41 contains, for example, silicon nitride (SIDs).

Although not shown in FIG. 5, the memory trench MT is divided by the memory pillar MP. That is, insulating layer 41 shown in FIG. 5 is divided by the memory pillar MP (not shown) at a position which is closer to or farther from the viewer of FIG. 5 along the X axis. Also, a memory trench MT (not shown) is provided at positions of memory pillars MP in string units SU0 and SU1 shown in FIG. 5. The memory trench MT (not shown) in string unit SU0 divides conductive layers 22 to 24 into conductive layers 22a, 23a and 24a_1 and conductive layers 22b, 23b and 24b_1. The memory trench MT (not shown) in string unit SU1 divides conductive layers 22 to 24 into conductive layers 22a, 23a_24a_2 and 24a_3 and conductive layers 22b, 23b and 24b_2.

Insulating layer 42 extends along the X axis between the adjacent two string units SU, passes through conductive layer 24, and the bottom surface thereof is located above conductive layer 23. That is, in the example shown in FIG. 5, insulating layer 42 functions as a slit SLT that divides conductive layer 24a in string unit SU1 into conductive layer 24a_2 and conductive layer 24a_3. Insulating layer 42 contains, for example, silicon nitride ($SiO_2$).

The memory pillar MP extends along the Z axis, passes through conductive layers 22 to 24, and the bottom surface thereof reaches conductive layer 21. The memory pillar MP includes a core layer 30, a semiconductor layer 31, a tunnel insulating film 32, charge storage layers 33a and 33b, block insulating films 34a and 34b and a cap layer 35.

The core layer 30 extends along the Z axis. The upper end of the core layer 30 is included in a layer higher than the layer in which conductive layer 24 is provided, and the lower end of the core layer 30 is included in a layer in which conductive layer 21 is provided. The core layer 30 contains, for example, silicon nitride ($SiO_2$).

The semiconductor layer 31 covers the bottom surface and side surfaces of the core layer 30. The upper end of the semiconductor layer 31 is included in a layer higher than the upper end of the core layer 30, and the lower end of the semiconductor layer 31 is in contact with conductive layer 21. The semiconductor layer 31 contains, for example, polysillcon.

The tunnel insulating film 32 covers the side surfaces and bottom surface of the semiconductor layer 31, except for the portion where conductive layer 21 and the semiconductor layer 31 are in contact with each other. The tunnel insulating film 32 contains, for example, silicon nitride ($SiO_2$).

In each of the layers in which conductive layers 22a to 24a are provided, charge storage layer 33a is provided between the tunnel insulating film 32 and the block insulating film 34a. The block insulating film 34a is provided as a continuous film along the Z axis such that it is located on each of charge storage layers 33a and between conductive layers 22a to 24a. The block insulating film 34a covers all charge storage layers 33a in the same memory pillar MP, except for the portion where the tunnel insulating film 32 and each of charge storage layers 33a are in contact with each other.

In each of the layers in which conductive layers 22b to 24b are provided, charge storage layer 33b is provided between the tunnel insulating film 32 and the block insulating film 34b. The block insulating film 34b is provided as a continuous film along the Z axis such that it is located on each of charge storage layers 33b and between conductive layers 22b to 24b. The block insulating film 34b covers all charge storage layers 33b in the same memory pillar MP, except for the portion where the tunnel insulating film 32 and each of charge storage layers 33b are in contact with each other.

Charge storage layers 33a and 33b contain, for example, polysilicon or a metal material. The block insulating films 34a and 34b contain, for example, silicon oxide ($SiO_2$). A high dielectric constant (High-k) material may be further provided between charge storage layer 33a and block insulating film 34a and between charge storage layer 33b and block insulating film 34b. The high dielectric constant material contains, for example, hafnium silicate (HfSiO) and has a function of improving the characteristics of the block insulating films 34a and 34b.

The cap layer 35 covers the upper surface of the core layer 30 and is in contact with the inner wall of that portion the semiconductor layer 31 which is above the core layer 30. The cap layer 35 contains, for example, polysilicon.

Conductive layer 36 that functions as a columnar contact CP is provided on the upper surfaces of the semiconductor layer 31 and cap layer 35 of the memory pillar MP. The upper surface of each conductive layer 36 is in contact with a corresponding one of conductive layers 25 and is electrically connected thereto. In the sectional view shown in FIG. 5, in string units SU0 and SU1, two memory pillars MP corresponding to the same bit line BL are shown, so that the two memory pillars MP are connected to the same conductive layer 25.

Next, the configuration in the section along the XY plane of the memory pillar MP will be described with reference to FIG. 6. FIG. 6 shows word lines WLa and WLb, memory trench MT, and memory pillar MP formed inside the word lines WLa and WLb and memory trench MT.

As shown in FIG. 6, the memory pillar MP is provided inside insulating layer 41 and two conductive layers 23a and 23b sandwiching the insulating layer 41 along the Y axis in the XY plane. Specifically, for example, the memory pillar MP has a substantially rectangular shape that is in contact with conductive layers 23a and 23b divides insulating layer 41 in the XY plane. The core layer 30 is provided in the center of the memory pillar MP, and the semiconductor layer 31 surrounds the side surfaces of the core layer 30. The tunnel insulating film 32 surrounds the side surfaces of the semiconductor layer 31. Of the side surfaces of the tunnel insulating film 32, two side surfaces arranged along the X axis are in contact with the insulating layer 41. Charge storage layer 33a is provided on the side surface of the tunnel insulating film 32 which is one of the two side surfaces arranged along the Y axis and which is closer to conductive layer 23a. Block insulating film 34a is provided between charge storage layer 33a and conductive layer 23a.

Charge storage layer 33a is provided on the side surface of the tunnel insulating film 32 which is one of the two side surfaces arranged along the Y axis and which is closer to conductive layer 23b. Block insulating film 34b is provided between charge storage layer 33b and conductive layers 23b.

In the configuration of the memory pillar MP described above, the portion where the memory pillar MP and conductive layer 22a intersect functions as select transistor STa2, and the portion where the memory pillar MP and conductive layer 22b intersect functions as select transistor STb2. The portion where the memory pillar MP and conductive layer 23a intersect functions as memory cell transistor MCa, and the portion where the memory pillar MP and conductive layer 23b intersect functions as memory cell transistor MCb. The portion where the memory pillar MP and conductive layer 24a intersect functions as select transistor STa1, and the portion where the memory pillar MP and conductive layer 24b intersect functions as select transistor STb1.

That is, semiconductor layer 31 is used as the channel and well regions of select transistors STa1 and STb1, memory cell transistors MCa and MCb and select transistors STa2 and STb2. Charge storage layer 33a is used as floating gates of memory cell transistor MCa and select transistors STa1 and STa2, and charge storage layer 33b is used as floating gates of memory cell transistor MCb and select transistors STb1 and STb2. Thus, each of the memory pillars MP functions as a set of two memory strings MSa and MSb, for example.

The configuration of the memory cell array 110 described above is merely an example, and the memory cell array 110 may have other configurations. For example, the number of conductive layers 23 is based on the number of word lines WL that can be designed to an arbitrary number. Select gate line SGD can be designed to have an arbitrary number of layers. A plurality of conductive layers 22 that are provided in a plurality of layers may be assigned to the select gate line SGS. Where the select gate line SGS is provided in a plurality of layers, conductors different from conductor 22 may be used. An arbitrary number of conductive layers functioning as dummy word lines (not shown) may be provided between the lowermost word line WL and select gate line SGS and between the uppermost word line WL and select gate line SGD. The memory pillar MP and conductive layer 25 may be electrically connected through two or more contacts, or may be electrically connected through other interconnects. Each slit SLT and each memory trench may include a plurality of types of insulators.

1.1.5 Threshold Voltage Distributions of Memory Cell Transistors

Next, a description will be given of threshold voltage distributions of memory cell transistors of the memory cell array 110.

In the present embodiment, one memory cell transistor MC can store, for example, 3-bit data. The bits of the 3-bit data will be referred to as a lower bit, a middle bit and an upper bit. A set of lower bits stored by memory cells belonging to the same cell unit CU will be called a lower page, a set of middle bits will be called a middle page, and a set of upper bits will be called an upper page. That is, three pages are allocated to one word line WL (one cell unit CU) in one substring unit SSU, and substring units SSU including eight word lines WL has a capacity of 24 pages. In other words, "page" can be defined as part of the memory space formed in cell unit CU. Data write and data read may be executed in units of page or in units of cell unit CU. On the other hand, data erase is executed in units of block BLK, as described above.

Figure 7:
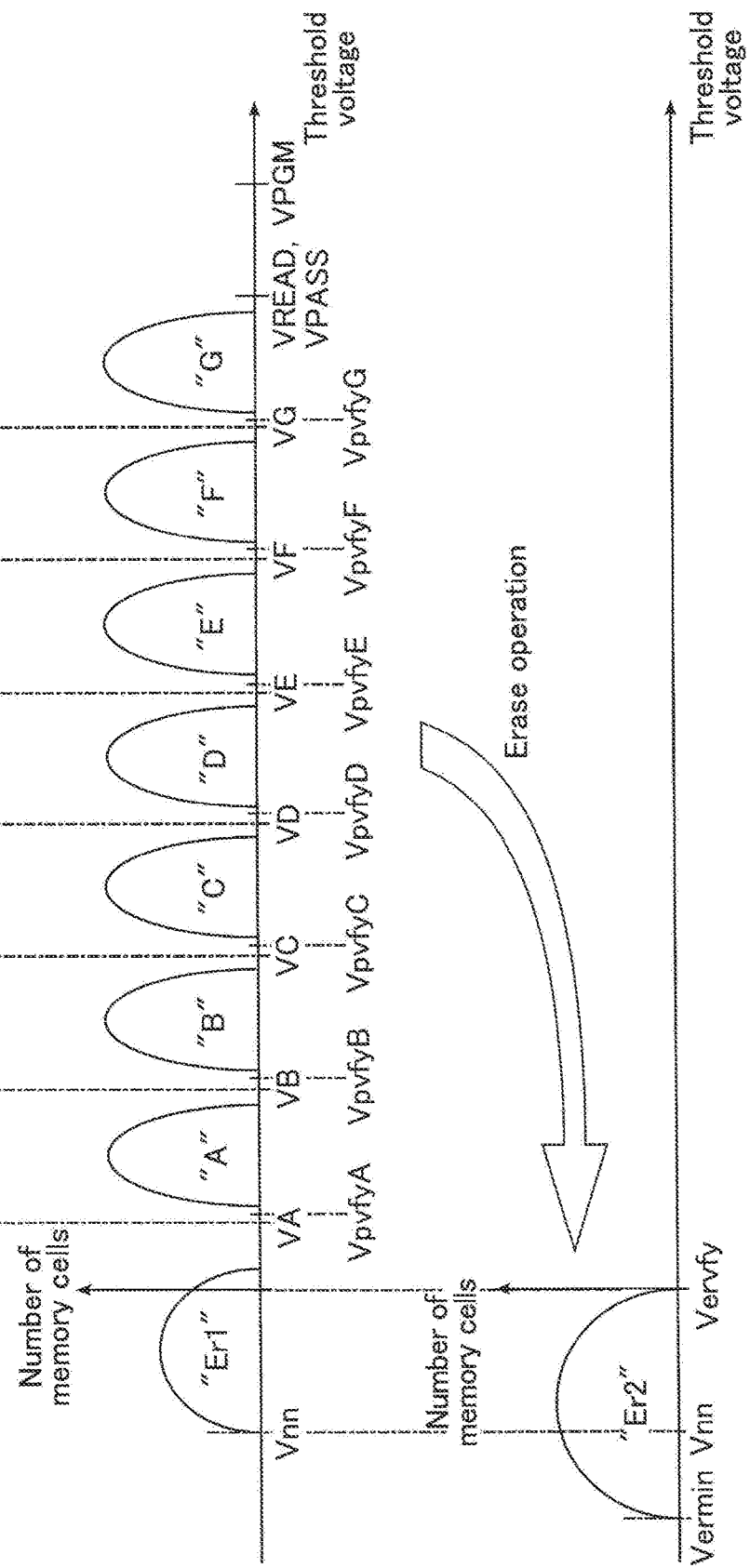
FIG. 7 is a conceptual diagram showing data and threshold voltage distribution of memory cell transistors of the semiconductor memory device according to the first embodiment.

FIG. 7 is a diagram showing how the threshold voltage distribution of each memory cell transistor MC of the memory cell array 110 is after the write operation and after the erase operation.

First, the threshold voltage distribution after the write operation will be described.

As described above, the memory cell transistor MC can store 3-bit data. That is, the memory cell transistor MC can take eight states in accordance with the threshold voltage after the write operation. These eight states will be referred to as "Er1" state, "A" state, "B" state, "C" state, . . . and "G" state in the ascending order of threshold voltage.

The threshold voltage of the memory cell transistor MC in the "Er1" state is equal to or higher than voltage Vnn and is lower than voltage VA (<Vnn), and corresponds to the data erased state. Voltage Vnn is, for example, a negative voltage (>0V), and is the lowest voltage that can be generated in the HAND flash memory 100. Voltage VA is a voltage of 0V or higher, for example.

The threshold voltage of the memory cell transistor MC in the "A" state is equal to or higher than voltage VA and is lower than voltage VB (>VA). The threshold voltage of the memory cell transistor MC in the "B" state is equal to or higher than voltage VB and is lower than voltage VC (>VB). The threshold voltage of the memory cell transistor MC in the "C" state is equal to or higher than voltage VC and is lower than voltage VD (>VC). The threshold voltage of the memory cell transistor MC in the "D" state is equal to or higher than voltage VD and is lower than voltage VE (>VD). The threshold voltage of the memory cell transistor MC in the "E" state is equal to or higher than voltage VE and is lower than voltage VF (>VE). The threshold voltage of the memory cell transistor MC in the "F" state is equal to or higher than voltage VF and is lower than voltage VG (>VF). The threshold voltage of the memory cell transistor MC in the "G" state is equal to or higher than voltage VG and is lower than both voltage VREAD (>VG) and voltage VPASS (>VG). Of the eight states distributed in this manner, the G" state is a state in which the threshold voltage is highest. Voltages VA to VG are collectively referred to as voltage VCGR or simply as "read voltage".

Voltage VREAD is, for example, a voltage applied to the word, line WL that is not a read target in the read operation, and is a voltage that turns on the memory cell transistor MT regardless of the data stored therein. Voltages VREAD and VPASS are both voltages that turn on the memory cell transistor MC regardless of the stored data, and are higher than read voltage VCGR. Voltage VPGM is a voltage that is applied to write target word line WL during the write operation, and that increases the threshold voltage by causing charge to be injected into charge storage layer 33 while turning on the memory cell transistor MC regardless of the stored data. That is, voltage VPGM is higher than voltage VPASS, In the write operation, the verify operation determines whether or not the memory cell transistor MC has transitioned to a predetermined state after program operation by voltage VPGM increases the threshold voltage. That is, in the verify operation, it is determined by voltage vpvfyA (>VA) whether or not the state of the memory cell transistor MC has transitioned to a state in which the threshold voltage is higher than that of state "Er1". Similarly, whether or not the state has transitioned to a state in which the threshold voltage is higher than those of states "A" to is determined by voltages VpvfyB (>VB), VpvfyC (>VC), VpvfyD (>VD), VpvfyE (>VE), VpvfyF (>VF) and VpvfyG (>VG). Voltages VpvfyA to VpvfyG are also collectively referred to as "verify voltage Vpvfy" or simply as "verify voltage".

The threshold voltage distribution described above is realized by writing 3-bit (3-page) data consisting of the aforementioned lower bit, middle bit and higher bit. That is, the "Er1" state to the "G" state are related to the lower bit, middle bit and upper bit, as follows; "Er1" stater "111" (in the order of "the upper bit/middle bit/lower bit") "A" state: "110" "B" state: "100" "C" state; "000" MBM state; "010" "E" state: "011", "F" state: "001" "G state"; "101". As can be seen from this, only one of the three bits changes between the data corresponding to the two states adjacent in the threshold voltage distribution.

To read a lower bit, a voltage corresponding to the boundary at which the value ("0" or "1") of the lower bit changes may be used, and the same applies to the middle bit and upper bit as well.

In the reading of the lower page, voltage VA that distinguishes between the "Er" state and the "A" state, and voltage VE that distinguishes between the "D" state and the "E" state are used as read voltages. In the reading of the middle page, voltage VB that distinguishes between the "A" state and the "B" state, voltage VD that distinguishes between the "C" state and the "D" state, and voltage VF that distinguishes between the "E" state and the "F" state are used as read voltages. In the reading of the upper page, voltage VC that distinguishes between the "B" state and the "C" state, and voltage VG that distinguishes between the "F" state and the "G" state are used as read voltages.

Next, a description will be given of how the threshold voltage distribution is immediately after the erase operation has executed for the memory cell transistor MC for which the write operation is executed.

When the erase operation is executed, all the memory cell transistors MC to be erased transition to the "E2" state. The threshold voltage of the memory cell transistor MC in the "Er2" state is lower than voltage Vervfy and is equal to or higher than voltage Vermin. Voltage Vervfy is a voltage that is equal to or lower than voltage VA and is higher than voltage Vnn (for example, 0V). Voltage Vermin is the lowest threshold voltage which the memory cell transistor MC can take by the erase operation, and is lower than voltage Vnn. That is, the "Er1" state and the "Er2" state differ from each other in that the "Er2" state includes a memory cell transistor MC having a threshold voltage lower than voltage Vnn but "Er1" state does not include such a memory cell transistor MC, and in that the "Er1" state includes a memory cell transistors MC having a threshold voltage equal to or higher than voltage Vervfy but the "Er2" state does not include such a memory cell transistor MC.

As described above, since the threshold voltage of the memory cell transistor MC in the "Er2" state is controlled to be equal to or lower than voltage Vervfy (≤VA), the memory cell transistor MC is not in any of the "A" state to the "G" state but the threshold voltage thereof can be lower than voltage Vnn. Therefore, the memory cell transistor MC in the "Er2" state can be turned on even when the lowest voltage that can be generated in the NAND flash memory 100 is applied to the word line WL.

Hereinafter, the memory cell transistor MC having a threshold voltage lower than voltage Vnn will be referred to as an "over-erased cell". Since the over-erased cell cannot fee turned off by application of a voltage to the word line WL, it may cause erroneous write and erroneous read. For this reason, it is desirable that the number of over-erased cells be suppressed by executing an over-erased cell write operation. In the description set forth below, a write operation that is executed to reduce the number of over-erased cells will be referred to as "over-erased cell write operation" to distinguish it from a normal write operation.

1.2 Operation

Subsequently, a description will fee given of operations of the memory system according to the present embodiment.

1.2.1 Outline of a Series of Operations Including Over-erased Cell Write. Operation FIG. 8 is a flowchart for illustrating a series of operations from an erase operation including an over-erased cell write operation to a normal write operation.

Figure 8:
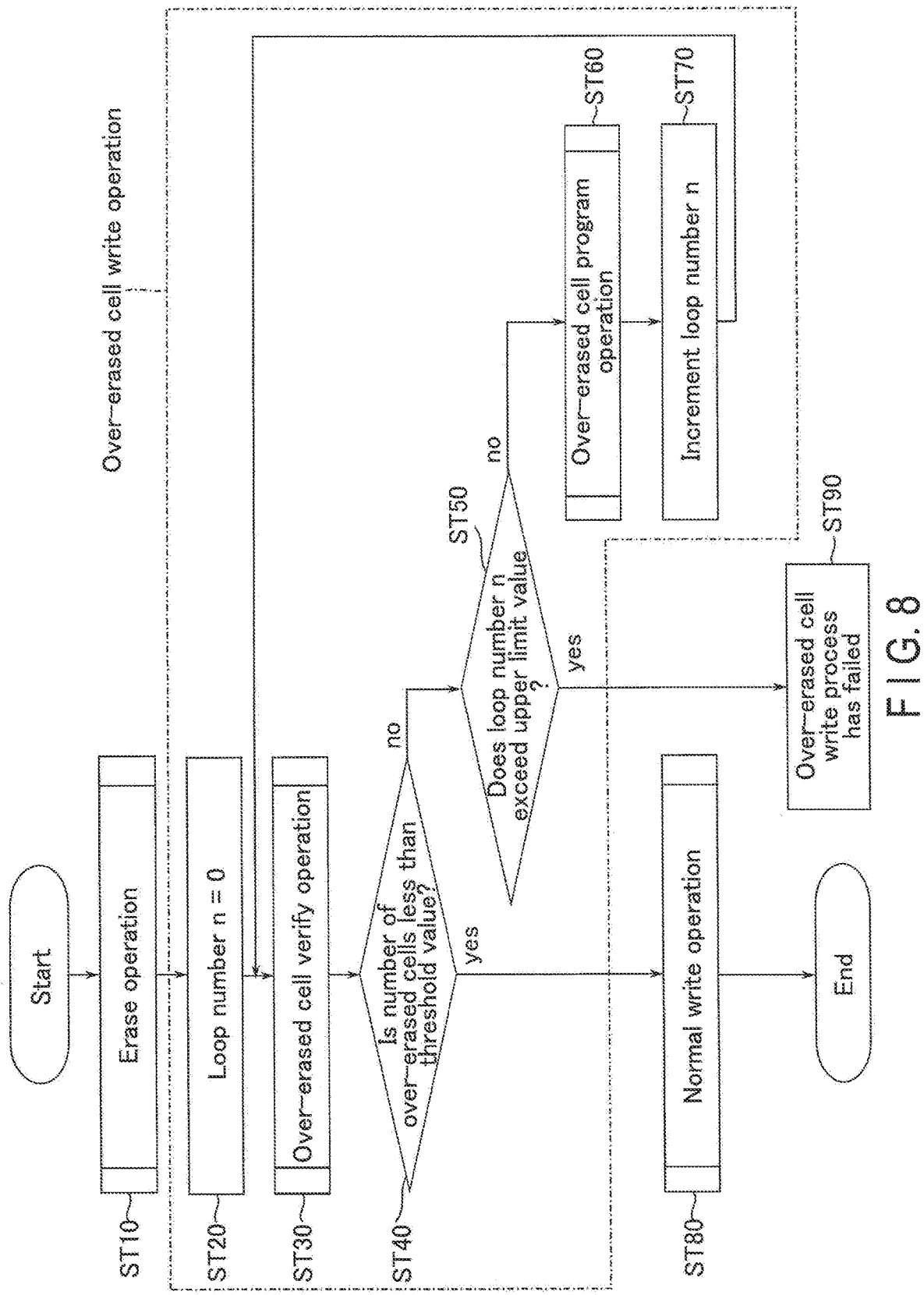
FIG. 8 is a flowchart for illustrating an outline of an over-erased cell write operation in the semiconductor memory device according to the first embodiment.

As shown in FIG. 8, in step ST10, the NAND flash memory 100 executes an erase operation based on a command from the memory controller 200. As a result, all the memory cell transistors MC in the block BLK to be erased transition to the "Er2" state from one of the "Er1" to "G" states.

In steps ST20 to ST70, the NAND flash memory 100 executes an over-erased cell write operation. The over-erased cell write operation includes an over-erased cell verify operation and an over-erased cell program operation. A set of the over-erased cell verify operation and the over-erased cell program operation is repeatedly executed within a predetermined number of times.

More specifically, in step ST2C, the sequencer 170 sets the loop number n of the over-erased cell write operation to "0" (0≤n≤N, N is a freely selected natural number).

In step ST30, the sequencer 170 controls the memory cell array 110, the row decoder 120, the sense amplifier 140, etc. to execute an over-erased cell verify operation, and obtains a number of over-erased cells. Details of the over-erased cell verify operation will be described later.

In step ST40, the sequencer 170 determines whether or not the number of over-erased cells acquired in step ST30 is less than a threshold value. If the number of over-erased cells is less than the threshold value (step ST40; yes), the process proceeds to step ST80. If the number of over-erased cells is equal to or larger than the threshold value (step ST40; no), the process proceeds to step ST50.

In step ST50, the sequencer 170 determines whether or not the loop number n of the over-erased cell write operation exceeds the upper limit value N. If the loop number n exceeds the upper limit value N (step ST50; yes), the process proceeds to step ST90. In step ST90, the sequencer 170 determines that the over-erased cell write process has failed, and the process proceeds to an exception process (not shown). If the loop number n does not exceed the upper limit value N (step ST50; no), the process proceeds to step ST60. It should be noted that the upper limit value N of the loop number n in the over-erased cell write operation is set to be different from the upper limit value of the loop number n in the normal write operation (for example, a value smaller than the upper limit value of the loop number n in the normal write operation).

In step ST60, the sequencer 170 controls the memory cell array 110, the row decoder 120, the sense amplifier 140, etc. to execute an over-erased cell program operation, and thereby increases threshold voltages of a plurality of memory cell transistors MC including at least over-erased cells. Details of the over-erased cell program operation will be described later.

In step ST70, the sequencer 170 increments the loop number n, and the process returns to step ST30. That is, a set of the over-erased cell verify operation and the over-erased cell program operation is repeatedly executed until it is determined that the number of over-erased cells is less than the threshold value or it is determined that the over-erased cell write operation has failed. As a result, the memory cell transistors MC for which the over-erased cell write operation is executed transition from the "Er2" state to the "Er1" state.

In step ST80, the NAND flash memory 100 executes a normal write operation for at least part of the memory cell transistors MC that have been subjected to the over-erased cell write operation, based on a command from the memory controller 200. As a result, the memory cell transistors MC for which the normal write operation is to be executed transition to one of the "Er1" to "G" states from the "Er1" state.

In this manner, the series of operations from the erase operation including the over-erased cell write operation to the normal write operation are ended.

1.2.2 Erase Operation and Normal Write Operation

Next, a description will be given of an erase operation and a normal write operation with reference to FIGS. 9 to 11.

Figure 9:
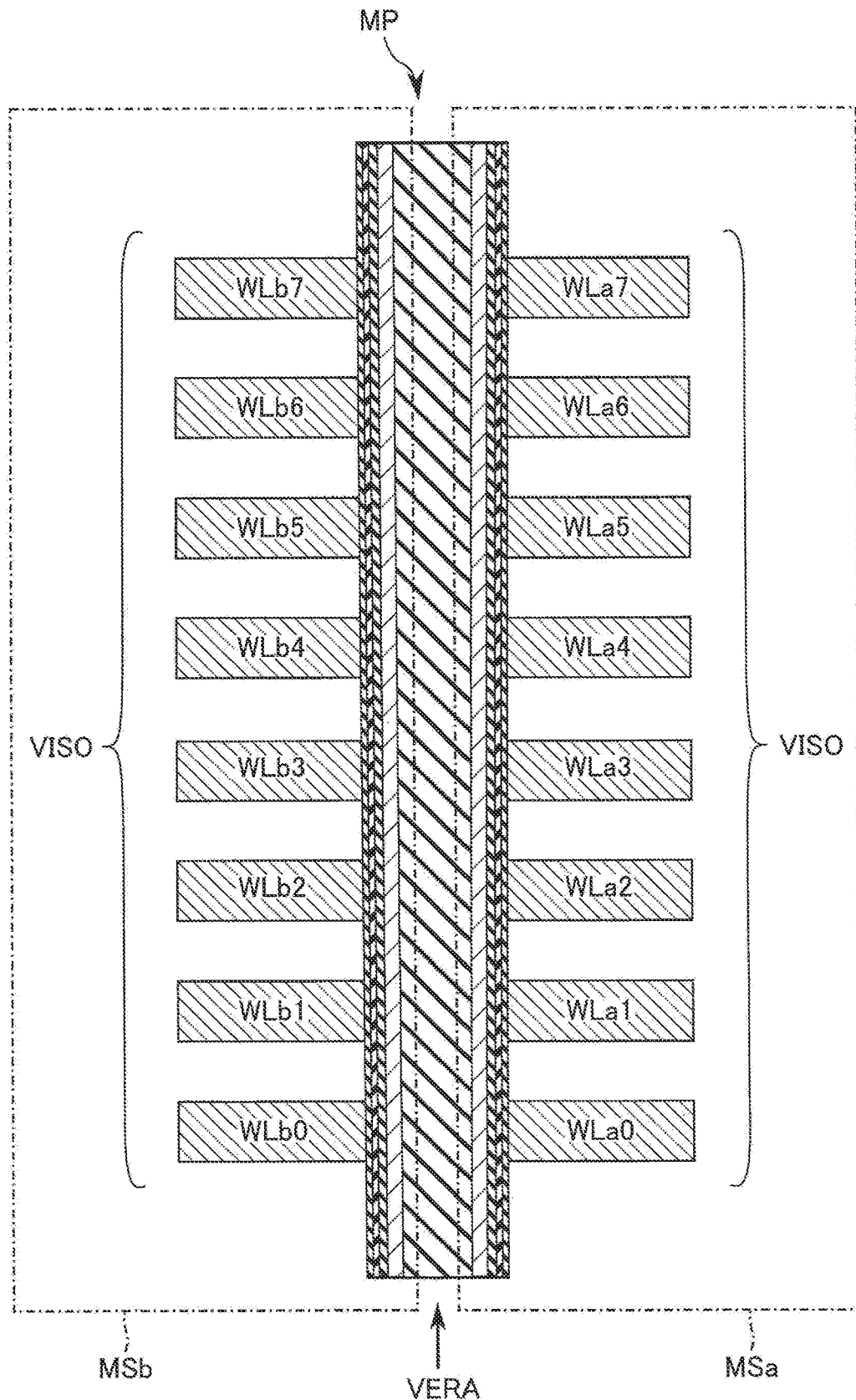
FIG. 9 is a schematic view for illustrating an erase operation in the semiconductor memory device according to the first embodiment.

FIG. 9 is a schematic diagram for illustrating voltages that are applied to various interconnects coupled to the memory strings MSa and MSb in the erase operation.

As shown in FIG. 9, in the erase operation, the row decoder 120 applies voltage VISO (for example, 0V) to word lanes WLa0 to WLa7 and WLb0 to WLb7, and a well driver (not shown) applies erase voltage VERA (VERA>VISO) to the semiconductor layer 31 that is the well region of the memory pillar MF. As a result, electrons are detrapped from the charge storage layer 33 of the memory cell transistor MC to the semiconductor layer 31, and the threshold voltage of the memory cell transistor MC decreases. This operation is executed simultaneously for all the string units SU0 to SU3 of the block BLK. It should be noted that select gate lines SGD and SGS may be in an electrically floating state, or may be applied with voltage VERA by the row decoder 120.

Figure 10:
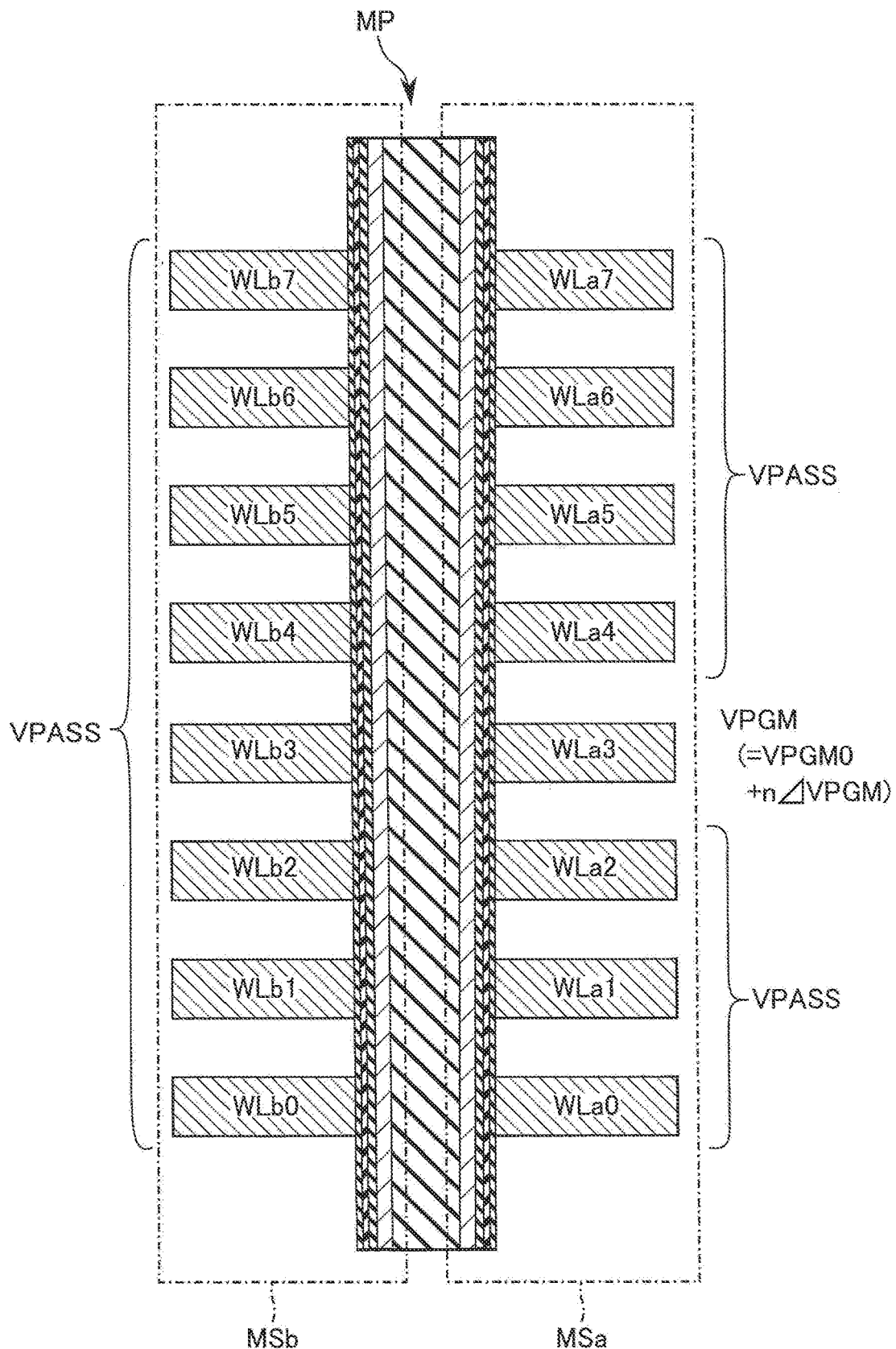
FIG. 10 is a schematic diagram for illustrating a verify operation of a normal write operation in the semiconductor memory device according to the first embodiment.

FIGS. 10 and 11 are schematic diagrams for illustrating voltages that are applied to various interconnects coupled to memory strings MSa and MSb in the program operation and the verify operation executed in the normal write operation. FIGS. 10 and 11 illustrate a case where memory cell transistor MCa3 of memory string MSa is selected as a write operation target.

As shown in FIG. 10, in the program operation in the n-th loop of the normal write operation, the row decoder 120 applies voltage VPGM (=VPGM0+nΔVPGW) to word line WLa3, and applies voltage VPASS to the other word lines WLa0 to WLa2, WLa4 to WLa7 and WLb0 to WLb7. As a result, all the memory cell transistors MC in the memory pillar MP are turned on, and only the threshold voltage of memory cell transistor MCa3 of the write operation target is increased, with the increase of the threshold voltages of the other memory cell transistors MC being suppressed.

As shown in FIG. 11, in the verify operation in the normal write operation, the row decoder 120 applies voltage Vpvfy to word line WLa3 and applies voltage VREAD to the other word lines WLa0 to WLa 2 and WLa4 to WLa7 of memory string MSa. Also, the row decoder 120 applies voltage Vnn to all the word lines WLb0 to WLb7 of memory string MSb. As a result, all the memory cell transistors MCb of memory string MSb are turned off, and it is expected that no channel is formed in the portion of memory string MSb of semiconductor layer 31. If no current flows through the memory pillar MP, the sequencer 170 determines that the threshold voltage of memory cell transistor MCa3 has exceeded a desired value, and determines that memory cell transistor MCa3 has passed the normal write operation.

As described above, however, part of the memory cell transistors MC in the "Er2" state may have a threshold voltage lower than voltage Vnn (may be over-erased cells). In this case, a current may flow through the memory pillar MP via memory string MSb regardless of whether memory cell transistor MCa3 is turned on or off by voltage Vpvfy in the verify operation. In this case, although the threshold voltage of memory cell transistor MCa3 exceeds the desired value, the sense amplifier 140 cannot detect this and cannot complete the write operation, which is not preferable. In the present embodiment, therefore, the number of over-erased cells is reduced by the over-erased cell write operation after the erase operation and before the normal write operation.

1.2.3 Over-erased Cell Write Operation

A description will be given of the over-erased cell write operation with reference to FIGS. 12 and 13.

Figure 12:
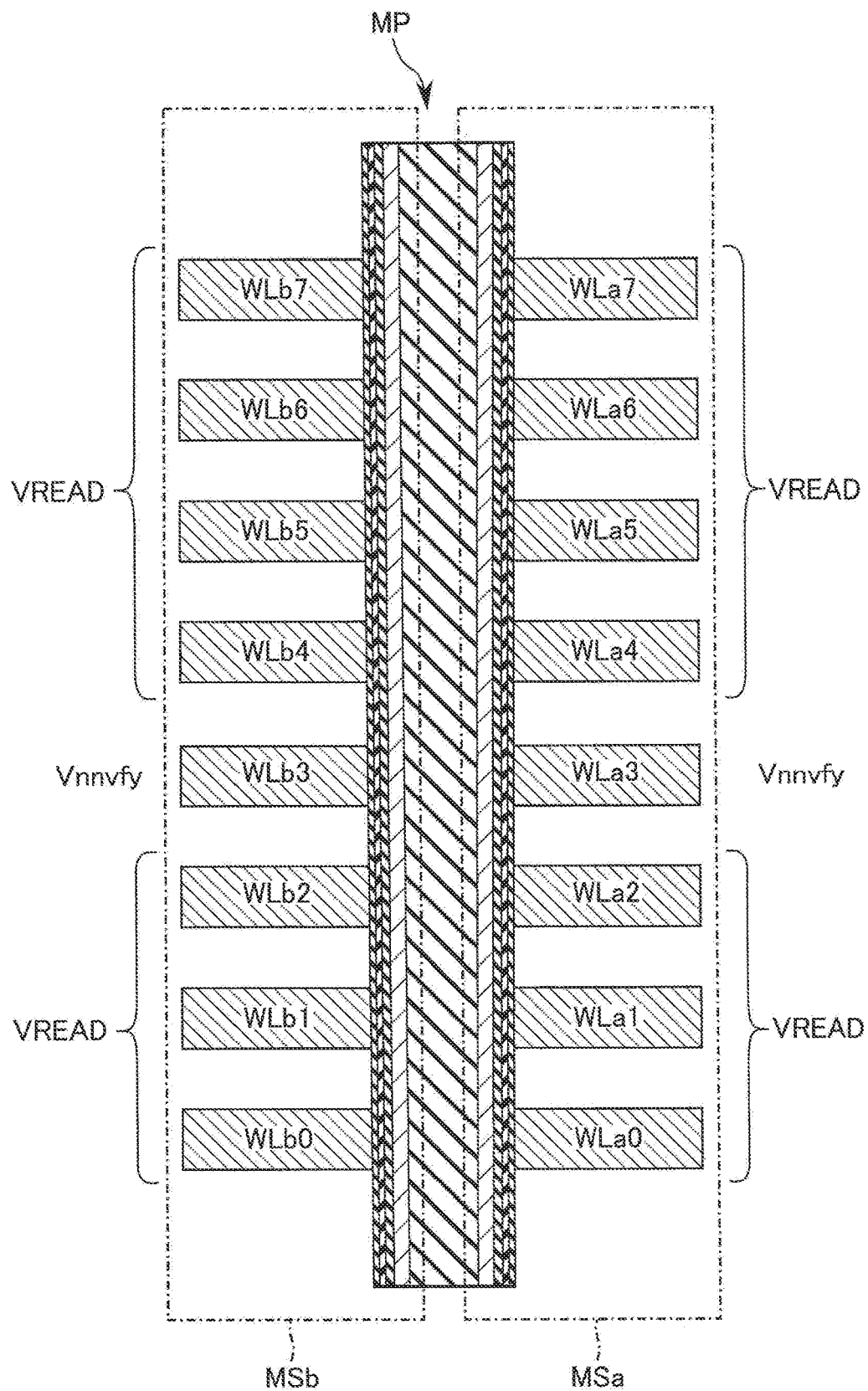
FIG. 12 is a schematic diagram for illustrating an over-erased cell verify operation in the semiconductor memory device according to the first embodiment.
Figure 13:
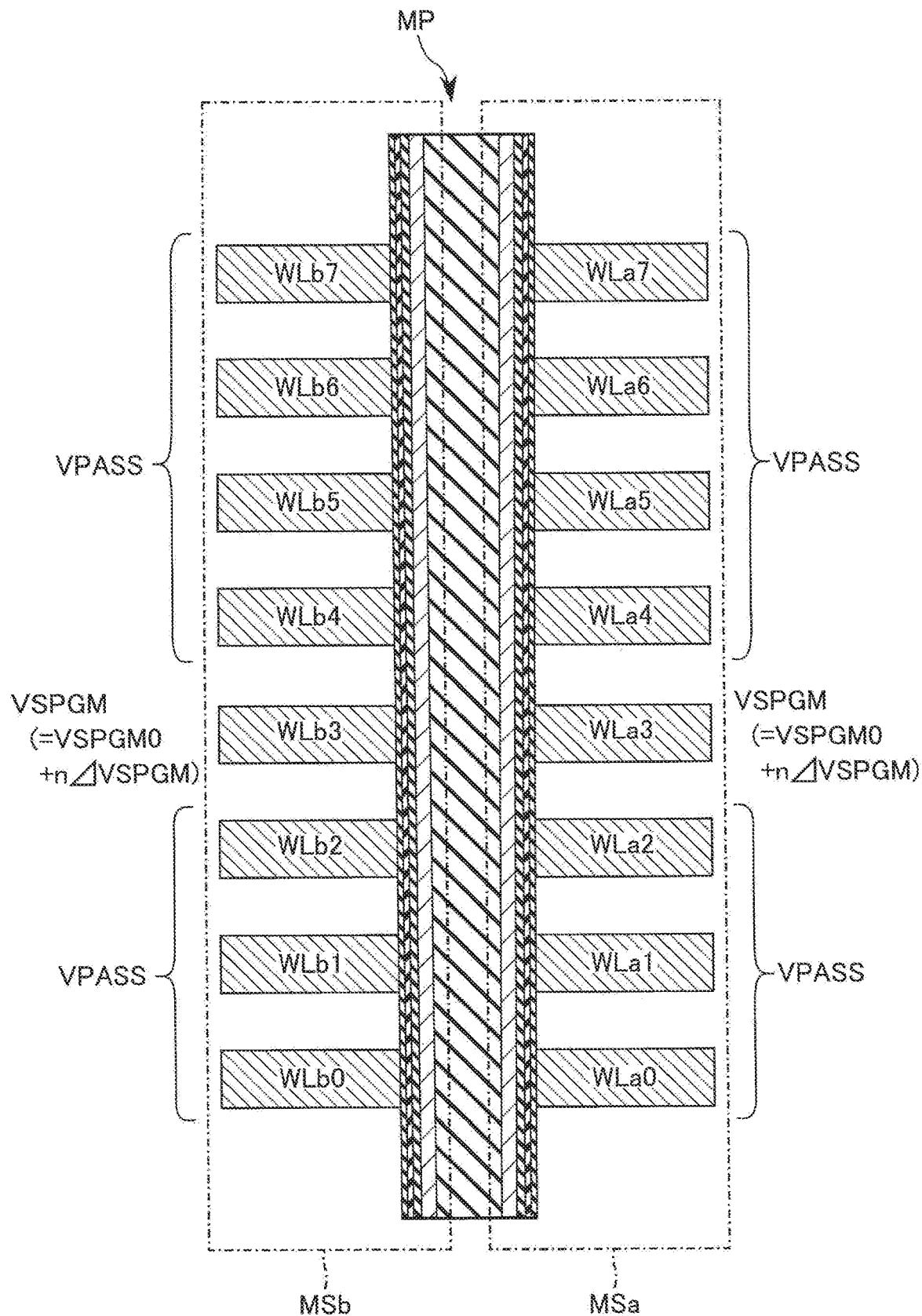
FIG. 13 is a schematic diagram for illustrating an over-erased cell program operation in the semiconductor memory device according to the first embodiment.

FIGS. 12 and 13 are schematic diagrams for illustrating voltages that are applied to various interconnects coupled to memory strings MSa and MSb in the verify operation and program operation executed in the over-erased cell write operation. Unlike the normal write operation, the over-erased cell write operation is executed for a set of two memory cell transistors MCa and MCb in the same layer of the memory pillar MP. In the description below, the set of memory cell transistors MCa and MCb for which the over-erased cell write operation is to be executed will also be referred to as a "pair cell". FIGS. 12 and 13 show a case where a set of memory cell transistors MCa3 and MCb3 is selected as a pair cell.

As shown in FIG. 12, in the over-erased cell verify operation, the row decoder 12C applies, for example, voltage Vnnvfy to the word lines WLa3 and WLb3 corresponding to a pair cell MC&3 and MLb3, and applies voltage VREAD to the other word lines WLa0 to WLa2, WLa4 to WLa7, WLb0 to WLb2 and WLb4 to WLb7. Voltage Vnnvfy is equal to or higher than voltage Vnn and is lower than voltage Vervfy. As a result, where the threshold voltages of pair cell MCa3 and MCb3 are both equal to or higher than voltage Vnnvfy, no channel is formed in the portion corresponding to word lines WLa3 and WLb3 of semiconductor layer 31, so that no current flows through the memory pillar MP. On the other hand, where the threshold voltage of at least one of cells included in pair cell MCa3 and MCb3 is lower than voltage Vnnvfy, a channel is formed in the portion corresponding to word lines WLa3 and WLb3 of semiconductor layer 31, so that a current flows through the memory pillar MP. Thus, in the over-erased cell verify operation, a determination can be made as to whether neither of cells included in pair cell MCa3 and MCb3 is an over-erased cell or at least one of them is an over-erased cell.

Where the sequencer 170 determines that at least one of cells included in pair cell MCa3 and MCb3 is an over-erased cell, the sequencer 170 counts up the number of over-erased cells determined in step ST4C shown in FIG. 8. If the number of pair cells in which over-erased cells exist exceeds a threshold value, the sequencer 170 recognises that the over-erased cell program operation has to be executed.

As shown in FIG. 13, in the over-erased cell program operation of the n-th loop, the row decoder 120 applies, for example, voltage VSPGM (=VSPGM0+nΔVSPGM) to word lines WLa3 and WLb3, and applies voltage VPASS to the other word lines WLa0 to WLa2, WLa4 to WLa7, WLb0 to WLb2 and WLb4 to WLb7. Voltage VSPGM is higher than voltage VPASS and can increase the threshold voltage of the memory cell transistor MC of the write target, but it is lower than voltage VPGM. Thus, the threshold voltages of pair cell MCa3 and MCb3 that are determined to include over-erased cells in the over erased cell verify operation can be simultaneously increased to the same degree, and the number of pair cell MCa and MCb determined to include over-erased cells can be reduced.

1.3 Advantages of Present Embodiment

According to the first embodiment, erroneous write of data can be suppressed. This advantage will be described in detail with reference to FIG. 14.

Figure 14:
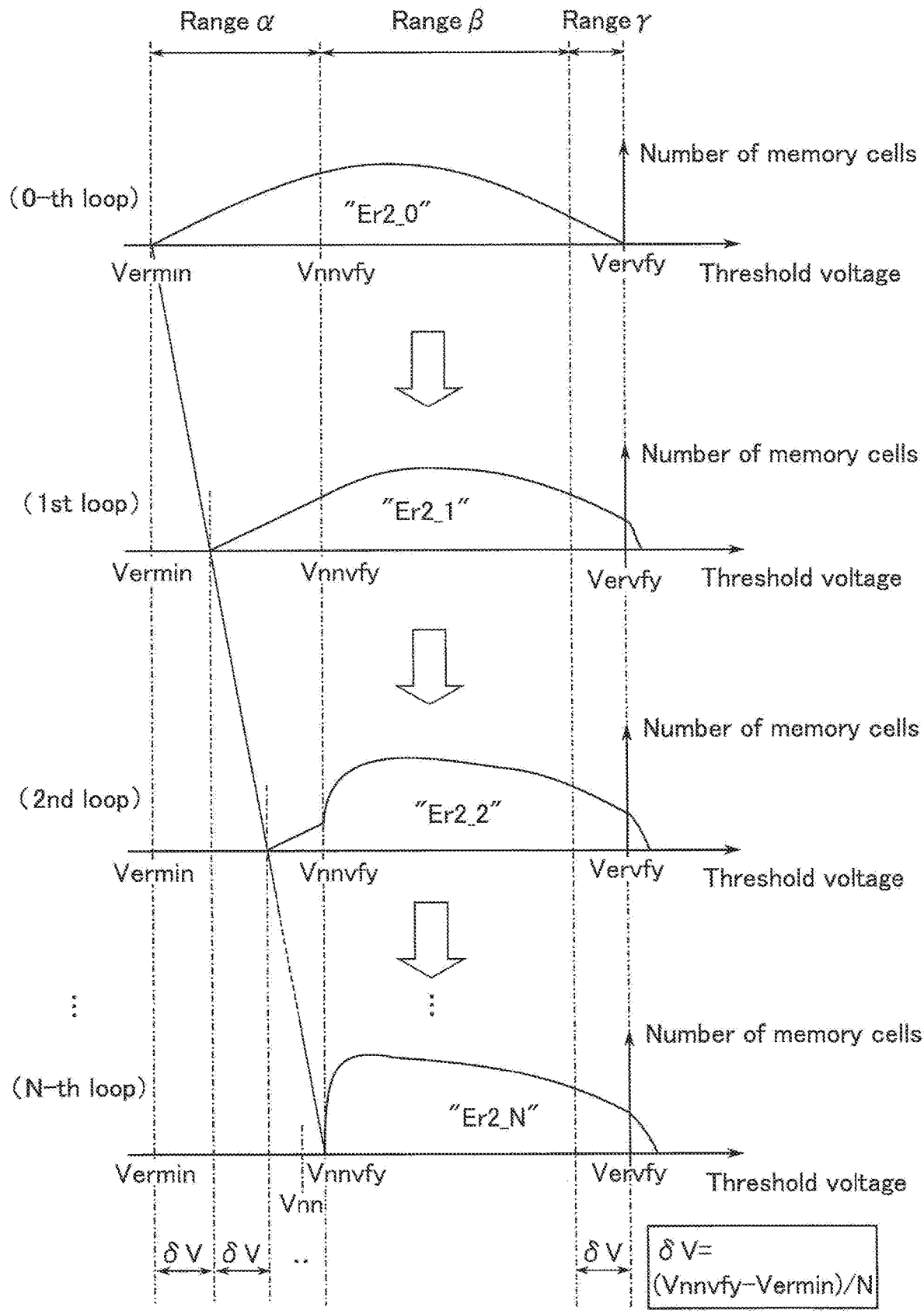
FIG. 14 is a schematic diagram for illustrating advantages of the first embodiment.

FIG. 14 is a schematic diagram for illustrating the advantages of the first embodiment. FIG. 14 schematically shows how the threshold voltage distribution of the "Er2" state is shifted to the high voltage side to such a degree as not to include over-erased cells, by a total of N loops of over-erased cell write operation. In FIG. 14, the threshold voltage distribution of the "Er2" state exhibited in the n-th loop ($0 \leq n \leq N$) will be indicated as an "Er2_n" state. In the threshold voltage distribution shown in FIG. 14, the range in which the voltage is equal to or higher than voltage Vermin and is lower than voltage Vnnvfy is indicated as range $\alpha$, the range in which the voltage is equal to or higher voltage Vnnvfy and is lower than voltage (Vervfy−δV) is indicated as range $\beta$, and the range in which the voltage equal to or higher than voltage (Vervfy−δV) and is lower than voltage Vervfy is indicated as range $\gamma$. It should be rioted here that δV=(Vnnvfy−Vermin)/N.

As shown in FIG. 14, in the threshold voltage distribution immediately after the erase operation, the lowest value is voltage Vermin and the highest value is voltage vervfy ("Er2_0" state). The sequencer 170 sets voltage ΔVSPGM such that the lowest value of the threshold voltage distribution is made higher than voltage Vnnvfy, by executing the loop of the over-erased cell verify operation and the over-erased cell program operation a maximum of N times. As a result, for example, the threshold voltages of the pair cell for which the over-erased cell write operation is to be executed car be increased by δV (=(Vnnvfy−Vermin)/N) by executing the loop once.

Specifically, a pair cell including at least one memory cell transistor MC having a threshold voltage within range $\alpha$ is extracted by the over-erased cell verify operation of the first loop. Then, the over-erased cell program operation of the first loop is executed, and the threshold voltages of the extracted pair cell are increased by δV. Thus, the lowest value of the threshold voltage of the "Er2_1" state is voltage (Vermin+δV).

Similarly, a pair cell including at least one memory cell transistor MC that has a threshold voltage within range $\alpha$ after the over-erased cell program operation of the first, loop is extracted by the over-erased cell verify operation of the second loop. The over-erased cell program operation of the second loop is executed, and the threshold voltages of the extracted pair cell is increased by δV. Thus, the lowest value of the threshold, voltage of the "Er2_2" state is voltage (Vermin+2δV).

By repeating the loop of the over-erased cell verify operation and over-erased cell program operation N times, the lowest value of the threshold voltage in the threshold voltage distribution of the "Er2_N" state becomes voltage (Vermin630 NδV) (≈Vnnvfy). As a result, the number of memory cell transistors MC whose threshold voltages are equal to or lower than voltage Vnn can be reduced, and erroneous write attributable to a cell which is included in the pair cell, which is not a write operation target and which has a threshold voltage is equal to or lower than voltage Vnn can be suppressed in the normal write operation.

It may be that a pair cell for which the over-erased cell write operation is to be executed includes one cell whose threshold voltage is in range $\alpha$ and another cell whose threshold voltage is in range $\gamma$. If the over-erased cell write operation is executed for such a pair cell, the threshold voltage of the second cell is also increased by δV, with the result that the threshold voltage of that cell may exceed voltage Vervfy. The threshold voltage of the cell may further exceed voltage VA, which may cause erroneous read. According to the first embodiment, a loop of the over-erased cell verify operation and the over-erased cell program operation is executed a number of times. As a result, the width δV (=(Vnnvfy−Vermin)/N)) of range $\gamma$ can be set in accordance with the maximum number N of loops. For this reason, the number of pair cells including a memory cell transistor whose threshold voltage is in range $\alpha$ and a memory cell transistor whose threshold voltage is in range $\gamma$ can be reduced to a negligible number (for example, to such a degree that errors are correctable by an error correction operation executed after the read operations). Therefore, the generation of cells that may cause erroneous read can be suppressed.

Further, as described above, the increased by one loop can be adjusted in accordance with voltage ΔVSPGM. For this reason, an increase in the time required for the over-erased cell write operation can be suppressed by reducing the maximum number N of loops while erroneous read, as described above.

In the over-erased cell write operation, the same target value of threshold voltage (that is, voltage Vnnvfy) is set for all over-erased cells. Therefore, the sequencer 170 can execute the over-erased cell write operation without receiving data from the memory controller 200.

2. Second Embodiment

Next, a description will be given of a semiconductor memory device according to the second embodiment. In the first embodiment, the over-erased cell write operation and the normal write operation. In the second embodiment, the execution timings at which the over-erased cell write operation is executed for pair cells MCa and MCb of the same block BLK are defined in more detail.

In the description below, the configurations and operations similar to those of the first embodiment will not be mentioned, and mainly the configurations and operations different from those of the first embodiment will be mentioned.

2.1 Order of Normal Write Operations

First, a description will be given, with reference to the table shown in FIG. 15, of an example of the order in which normal write operations are executed in the block BLK of the semiconductor memory device according to the second embodiment.

In FIG. 15, the memory cell transistors MC of the same block BLK are classified into 64 (=8×4×2) transistors according to layers L (L0 to L7) corresponding to stacking positions at which word lines WL coupled to the memory cell transistors MC are stacked along the Z axis, string units SU (SU0 to SU3) to which the memory cell transistor MC belongs, and substring units SSU (SSUa or SSUb) in each string unit SU. Whether memory cell transistor MC is coupled to word line WLa or word line WLb in the same layer can be identified depending on substring unit SSUa or SSUb to which memory cell transistor MC belongs.

As shown in FIG. 15, the normal write operation is sequentially executed for the memory cell transistors MC of the same block BLK which are classified into 64 groups. In the example shown in FIG. 15, the execution order is indicated by numbers shown in ascending order. It is assumed that the erase operation is executed before the normal write operations (that is, as the "0"-th operation).

First, the lowermost layer L0 is selected, and the write operation for the memory cell transistor MC corresponding to layer L0 is executed. Specifically, data is written first to the memory cell transistors MC corresponding to layer L0 and corresponding to substring unit SSUa of string unit SU0. Hereinafter, for convenience of description, the memory cell transistors MC corresponding to layer Lx ($0 \leq x \leq 7$) and corresponding to substring unit SSUa of string unit SUy ($0 \leq y \leq 3$) will be denoted as memory cell transistors MCax(y).

Subsequently, as the second write operation, data is written to the memory cell transistors MC corresponding to layer L0 and corresponding to substring unit SSUb of string unit SU0. Hereinafter, for convenience of description, the memory cell transistor MC corresponding to layer Lx and corresponding to substring unit SSUb of string unit SUy ($0 \leq y \leq 3$) will be denoted as memory cell transistors MCbx(y).

In the same manner, data is written to memory cell transistors MCb0(1), MCa0(1), MCa0(2), MCb0(2), MCb0(3) and MCa0(3) in this order as the third to eighth operations, respectively.

When the write operation to the memory cell transistors MC corresponding to layer L0 is completed, layer L1 is selected. The write order for the memory cell transistors MC corresponding to layer L1 is similar to the case of layer L0. That is, data is written to memory cell transistors MCa1(0), MCb1(0), MCb1(1), MCa1(1), MCa1(2), MCb1(2), MCb1(3) and MCa1(3) in this order as the ninth to sixteenth operations, respectively.

Similarly, data is written from the lowermost layer L0 toward the uppermost layer L-7 in ascending order.

The example shown in FIG. 15 is merely an example, and this is not restrictive. For example, data may be written to the memory cell transistors of the same layer Lx in the order of MCax(0), MCbx(0), MCax(1), MCbx(1), MCax(2), MCbx (2), MCax (3) and MCbx(3).

2.2 Order of Over-erased Cell Write Operation and Normal Write Operation

Next, a description will be given, with reference to FIGS. 16 and 17, of the order in which the over-erased cell write operation and the normal write operation are executed in the semiconductor memory device according to the second embodiment.

Figure 16:
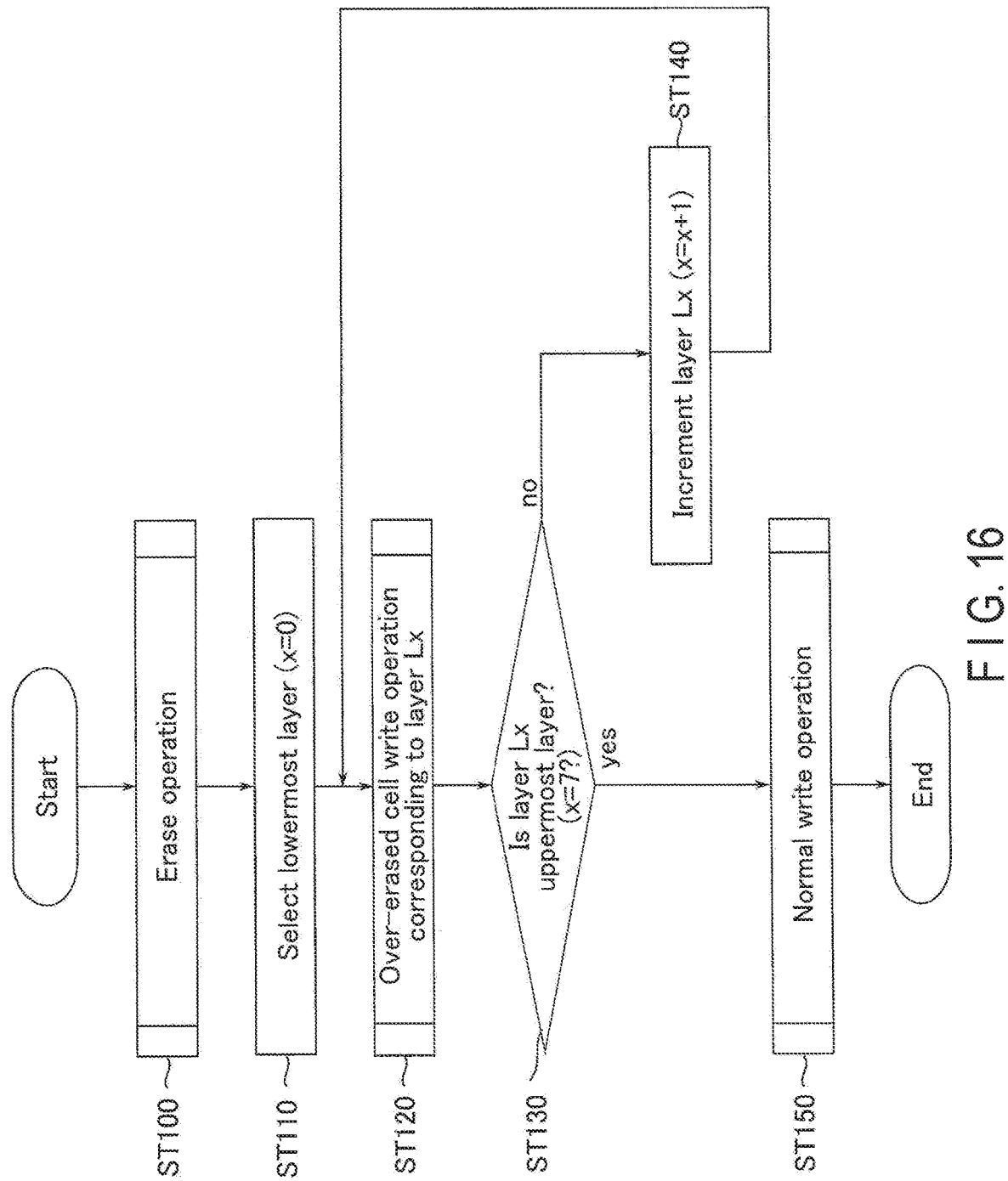
FIG. 16 is a flowchart for illustrating an order in which an over-erased cell write operation and a normal write operation are executed for a block of the semiconductor memory device according to the second embodiment.

FIG. 16 is a flowchart for illustrating how a series of operations from the erase operation to the normal write operation are executed in the semiconductor memory device according to the second embodiment. FIG. 16 corresponds to FIG. 8 referred to in connection with the first embodiment. FIG. 17 is a table schematically showing an example of the order in which the over-erased cell write operation and the normal write operation are executed when the series of operations are executed according to FIG. 16.

First, a series of operations from the erase operation to the normal write operation will be described with reference to FIG. 16.

As shown in FIG. 16, in step ST100, the sequencer 170 executes an erase operation. Since this operation is similar to that shown in step ST10 of FIG. 8, the description thereof is omitted.

In step ST110, the sequencer 170 selects the lowermost layer as layer Lx for which the over-erased cell write operation (x=0) is to be executed. Layer Lx selected in step ST110 has no relation to the target of a normal write operation executed in step ST150 described later.

In step ST120, the sequencer 170 executes an over-erased cell write operation corresponding to layer Lx. As a result of this operation, operations similar to those shown in steps ST20 to ST70 in FIG. 8 are executed for a plurality of pair cells MCa and MCb corresponding to layer Lx. Thus, the over-erased cell program operation is executed for the pair cells MCa and MCb including over-erased cells existing in layer Lx, and the number of over-erased cells in layer Lx is reduced to be below the threshold value.

In step ST130, the sequencer 170 determines whether or not layer Lx is the uppermost layer (whether or not x=7). Where layer Lx is not the uppermost layer (x≠7) (step ST130; no), the process proceeds to step ST150, and where layer Lx is the uppermost layer (x=7) (step ST130; yes), the process proceeds to step ST140.

In step ST140, the sequencer 170 increments x (x=x+1) (layer L that is one layer higher than layer Lx is selected), and thereafter the process returns to step ST120. Thus, steps ST120 to ST140 are repeatedly executed until layer Lx is the uppermost layer. That is, the sequencer 170 confirms that the over-erased cell write operation has been executed for all the layers L of the block BLK, and then proceeds to step ST150.

In step ST150, the sequencer 170 executes a normal write operation. Since this operation is similar to that shown in step ST80 of FIG. 8, the description thereof is omitted. In this manner, the erase operation and the normal write operation are ended, including the ever-erased cell write operation.

Next, the order in which the operations shown in FIG. 16 are executed will be described in detail with reference to FIG. 17. In FIG. 17, the rows corresponding to the normal write operation and the rows corresponding to the over-erased cell write operation are distinguished as "NW" rows and "EW" rows, respectively. In FIG. 17, for example, the operations executed between the adjacent two of the 0th to 64th operations shown in FIG. 15 are denoted by attaching "–" and the number starting from "1" in the order of execution. For example, where three operations are executed between the z-th ($0 \leq z \leq 64$) operation and the (z+1)-th operation, the three operations are denoted as "z–1", "z–2" and "z–3". In this case, the z-th operation is expressed as "z–0" for the sake of convenience. The "z–0"-th operation is also denoted as operation <z–0>.

As shown in FIG. 17, in the second embodiment, erase operation <0–0> is first executed, and then over-erased cell write operations <0–1> to <0–32> are executed before normal write operations <1> to <64> are executed. The case assumed to use such an execution order is, for example, the case where the HAND flash memory 100 receives a command related to erase operation <0–0> from the memoir, controller 200, over-erased cell write operations <0–1> to <0–32> are executed in succession to erase operation <0–0>.

Specifically, layer 1*0 is first selected as the lowermost layer, and over-erased cell write operation <0–1> is executed for the pair cells MCa0 and MCb0 corresponding to string unit SU0. Subsequently, over-erased cell write operation <0–2> for the pair cells MCa0 and MCb0 corresponding to string unit SU1, overwrite cell write operation <0–3> for the pair cells MCa0 and MCb0 corresponding to string unit SU2, and over-erased cell write operation <0–4> for the pair cells MCa0 and MCb0 corresponding string unit SU3 are executed in this order.

Next, layer L1 that is one layer higher than layer L0 is selected, and over-erased cell write operations <0–5> to <0-8> are executed in the order of string units SU0 to SU3, using the same order as described above. Similarly, over-erased cell write operations <0-9> to <0-12>, <0-13> to <0-16>, <0-17> to <0-20>, <0-21> to <0-24>, <0-25> to <0-28>, and <0-29> to <0-32> are executed in the order of layers L2 to L7.

After the over-erased cell write operations for all the layers L0 to L1 are completed, normal write operations <1> to <64> are executed.

2.3 Advantages of Present Embodiment

According to the second embodiment, an over-erased cell write operation is executed for all the pair cells of block BLK, after an erase operation is executed for the block BLK and before a normal write operation is executed. Thus, the order of the erase operation, over-erased cell write operation and normal write operation described in connection with the first embodiment can be applied to the actual memory cell array lie. For this reason, even if any pair cell in the block BLK becomes an over-erased cell by the erase operation, the threshold voltage of the over-erased cell can be set to voltage Vnn or higher before the normal write operation is executed. Therefore, erroneous write of data can be suppressed.

In the second embodiment, the over-erased cell write operation is executed, for example, in succession to the erase operation. Thus, when the sequencer 170 receives a command to execute the erase operation, the sequencer 170 can execute the over-erased cell write operation in succession to the erase operation without receiving new data.

3. Third Embodiment

Next, a semiconductor memory device according to a third embodiment will be described. In connection with the second embodiment, reference was made to the case where the over-erased cell write operation for all the pair cells of the same block BLK is executed after the erase operation and before the normal write operation. The third embodiment will be described referring to a case where the over-erased cell write operation is executed between the erase operation and the normal write operation and is distributed during the normal write operation.

In the description below, the configurations and operations similar to those of the second embodiment will not be mentioned, and mainly the configurations and operations different from these of the second embodiment will be mentioned.

3.1 Order of Erase Operation Including Over-erased Cell Write Operation, and Normal Write Operation Next, a description will be given, with reference to FIGS. 18 and 19, of the order in which an erase operation including an over-erased cell write operation, and a normal write operation are executed in a semiconductor memory device according to the third embodiment.

Figure 18:
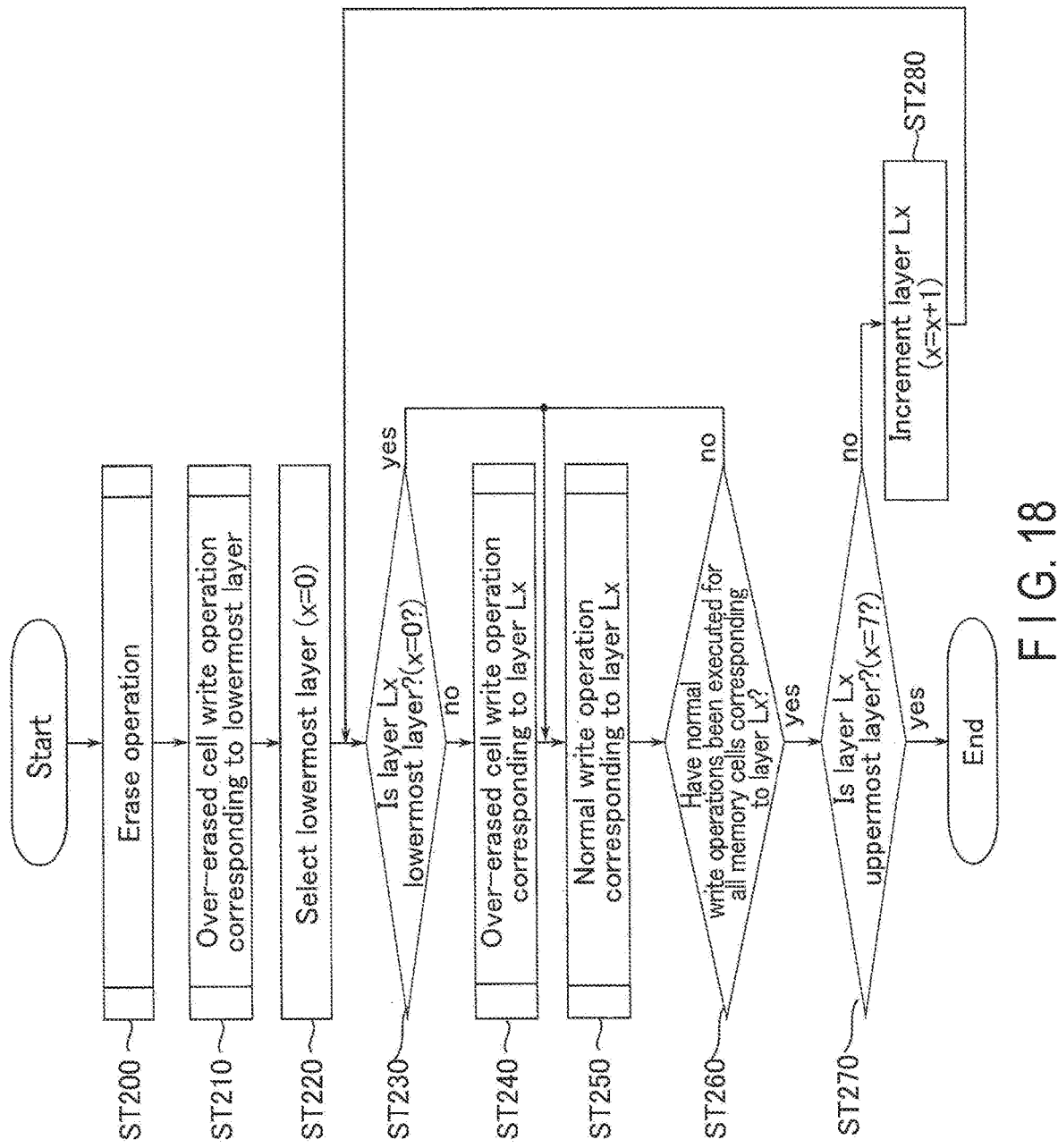
FIG. 18 is a flowchart for illustrating an order in which an over-erased cell write operation and normal a write operation are executed for a block of a semiconductor memory device according to a third embodiment.

FIG. 18 is a flowchart for illustrating how a series of operations from the erase operation to the normal write operation are executed in the semiconductor memory device according to the third embodiment. FIG. 18 corresponds to FIG. 16 referred to in connection with the second embodiment. FIG. 19 is a table schematically showing an example of the order in which the over-erased cell write operation and the normal write operation are executed when the series of operations are executed according to FIG. 18. FIG. 19 corresponds to FIG. 17 referred to in connection with the second embodiment.

First, a series of operations from the erase operation to the normal write operation will be described with reference to FIG. 18.

As shown in FIG. 18, in step ST200, the sequencer 170 executes an erase operation when it receives a command set corresponding to the erase operation from the memory controller 200. Since this operation is similar to that shown in step ST100 of FIG. 16, the description thereof is omitted.

In step ST210, the sequencer 170 executes an over-erased cell write operation for the lowermost layer in succession to the erase operation described in step ST200.

After steps ST200 and ST210, the NAND flash memory 100 receives a command set (not shown) corresponding to a normal write operation, for example, from the memory controller 200.

In step ST220, when the sequencer 170 receives a command set corresponding to the normal write operation from the memory controller 200, the sequencer 170 selects the lowermost layer as layer Lx (x=0) for which the normal write operation and the over-erased cell write operation are to be executed.

In step ST230, the sequencer 170 determines whether or not layer Lx is the lowermost layer (whether or not x=0). Where layer Lx is not the lowermost layer (x≠0) (step ST230; no), the process proceeds to step ST240, and where layer Lx is the lowermost layer (x=0) (step ST230; yes), the process proceeds to step ST250, skipping step ST240.

In step ST240, the sequencer 170 executes an over-erased cell write operation corresponding to layer Lx. Since this operation is similar to that shown in step ST120 of FIG. 16, the description thereof is omitted.

In step ST250, the sequencer 170 executes a normal write operation corresponding to layer Lx. As described above, the normal write operation is executed in units of substring unit SSU in layer Lx.

In step ST260, the sequencer 170 determines whether or not a normal write operation has executed for all the memory cell transistors MC corresponding to layer Lx. Where it is determined that the operation has not been completed (step ST260; no), the process returns to step ST250, and step ST250 is repeatedly executed for the substring units SSU of layer Lx for which the normal write operation has not been executed, until it is determined that the operation has been completed. If it is determined that the operation has been completed (step ST260; yes), the process proceeds to step ST270.

In step ST270, the sequencer 170 determines whether or not layer Lx is the uppermost layer (whether or not x=7). Where layer Lx is not the uppermost layer (x≠7) (step ST270; no), the process proceeds to step ST280, and where layer Lx is the uppermost layer (x=7) (step ST270; yes), the process is ended.

In step ST280, the sequencer 170 Increments x (x=x+1) (layer L that is one layer higher than layer Lx is selected), and thereafter the process returns to step ST230. Thus, steps ST230 to ST280 are repeatedly executed until layer Lx is the uppermost layer. That is, the sequencer 170 confirms that the normal write operation has been executed after the over-erased cell write operation is executed for all the layers L of the block BLK, and ends the process.

In the above manner, the erase operation including the over-erased cell write operation, and the normal write operation are ended.

Next, the order in which the operations shown in FIG. 18 are executed will be described in detail with reference to FIG. 18.

As shown in FIG. 19, in the third embodiment, after the "0-0"-th erase operation is executed and before the normal write operations <1> to <8> corresponding to the lowermost layer L0 are executed, over-erased cell write operations <0-1> to <0-4> respectively corresponding to string units SU0 to SU3 are executed in layer L0. A case assumed to use such an execution order is, for example, a case where the NAND flash memory 100 receives a command related to erase operation <0-0> from the memory controller 200, over-erased cell write operations <0-1> to <0-4> are sequentially executed in succession to erase operation <0-0>.

Specifically, layer L0 is first selected as the lowermost layer, and over-erased cell write operation <0-1> is executed for the pair cells MCa0 (0) and MCb0(0) corresponding to string unit SU0.

Subsequently, in layer L0, over-erased cell write operation <0-2> corresponding to string unit SU1, overwrite cell write operation <0-3> corresponding to string unit SU2, and over-erased cell write operation <0-4> corresponding string unit SU3 are executed in this order.

Next, normal write operations <1> to <7> for memory cell transistors MCa0(0), KCb0(0), MCb0(1), MCa0(1), MCa0(2), MCb0(2) and MCb0(3) are executed in this order.

Then, after normal write operation <8-0> for memory cell transistors MCa0(3) is executed, layer L1 that is one layer higher than layer L0 is selected, and over-erased cell write operations <8-1> to <8-4> respectively corresponding to string units SU0 to SU3 are executed in Layer L1.

Similarly, at the end of normal write operations for selected layer Lx, over-erased cell write operations for layer L(x+1), which is one layer higher, are executed.

3.2 Advantages of Present Embodiment

According to the third embodiment, an over-erased cell write operation is executed for the lowermost layer L0 of block BLK, after an erase operation is executed for the block BLK and before a normal write operation is executed. After the normal write operation corresponding to layer Lx is executed and before the normal write operation corresponding to layer L(x+1) is executed, the over-erased cell write operation corresponding to the layer L(x+1) is executed. That is, the over-erased cell write operation is executed divisionally for each layer between the erase operation and the normal write operation corresponding to the lowermost layer L0, or between the normal write operation corresponding to layer Lx and the normal write operation corresponding to the layer L(x+1). As a result, the execution time of the over-erased cell write operation executed subsequent to the erase operation or the normal write operation can be divided or distributed for each layer L. For this reason, the time required for executing the over-erased cell write operation can be distributed within block BLK, and the increase in load can be smoothed.

4. Fourth Embodiment

Next, a semiconductor memory device according to a fourth embodiment will be described. In connection with the third embodiment, reference was made to the case where the over-erased cell write operation is executed in advance for layer Lx before the normal write operation is executed for that layer Lx. In connection with the fourth embodiment, reference will be made to a case where the over-erased cell write operation is executed in advance for string unit SVy of layer Lx before the normal write operation is executed for that string unit SUy of the layer Lx.

In the description below, the configurations and operations similar to those of the third embodiment will not be mentioned, and mainly the configurations and operations different from those of the third embodiment will be mentioned.

4.1 Order of Erase Operation Including Over-erased Cell Write Operation, and Normal Write Operation Next, a description will be given, with reference to FIGS. 20 and 21, of the order in which an erase operation including an over-erased cell write operation, and a normal write operation are executed in a semiconductor memory device according to the fourth embodiment.

FIG. 20 is a flowchart for illustrating how a series of operations from the erase operation to the normal write operation are executed in the semiconductor memory device according to the fourth embodiment. FIG. 20 corresponds to FIG. 18 referred to in connection with the third embodiment. FIG. 21 is a table schematically showing an example of the order in which the over-erased cell write operation and the normal, write operation are executed when the series of operations are executed according to FIG. 20. FIG. 20 corresponds to FIG. 19 referred to in connection with the third embodiment.

First, a series of operations from the erase operation to the normal write operation will be described with reference to FIG. 20.

As shown in FIG. 20, in step ST300, the sequencer 170 executes an erase operation when it receives a command set corresponding to the erase operation from the memory controller 200. Since this operation is similar to that shown in step ST200 of FIG. 18, the description thereof is omitted.

In step ST310, the sequencer 170 executes an over-erased cell write operation for the lowermost layer and the first string unit SU in succession to the erase operation described in step ST300.

After steps ST300 and ST310, the N&ND flash memory 100 receives a command set (not shown) corresponding to a normal write operation, for example, from the memory controller 200.

In step ST320, upon reception of the command set corresponding to the normal write operation from the memory controller 200, the sequencer 170 selects the lowermost layer and the first string unit SU as layer Lx and string unit SUy (x=0, y=0) for which the normal write operation and the over-erased cell write operation are to be executed.

In step ST330, the sequencer 170 determines whether or not layer Lx is the lowermost layer and whether string unit SUy is the first string unit SU (whether or not x=0 and y=0). Where layer Lx is not the lowermost layer, or string unit SUy is not the first string unit. SU (x≠0 or y≠0) (step ST330; no), the process proceeds to step ST340. Where layer Lx is the lowermost layer and string unit SUy is the first string unit SU (x=0 and y=0) (step ST330; yes), the process proceeds to step ST350, skipping step ST340.

In step ST340, the sequencer 170 executes an over-erased cell write operation corresponding to layer Lx and string unit SUy. As described above, the over-erased cell write operation is executed in units of string unit SU. That is, the sequencer 170 executes the over-erased cell write operation for substring units SSUa and SSUb of string unit SUy corresponding to layer Lx.

In step ST350, the sequencer 170 executes a normal write operation corresponding to layer Lx. As described above, the normal write operation is executed in units of substring unit SSU in layer Lx. That is, the sequencer 17C executes a normal write operation for either of substring units SSUa and SSUb of string unit SUy corresponding to layer Lx.

In step ST360, the sequencer 170 determines whether or not a normal write operation has been executed for all the memory cell transistors MC corresponding to layer Lx and string unit SUy. Where it is determined that the operation has not been completed (step ST360; no), the process returns to step ST350, and step ST350 is repeatedly executed for the substring units SSU of layer Lx and string unit SUy for which the normal write operation has not been executed, until it is determined that the operation has been completed. If it is determined that the operation has been completed (step ST360; yes), the process proceeds to step ST370.

In step ST370, the sequencer 170 determines whether or not string unit SUy is the last string unit SU (whether or not y=3). Where string unit. SUy is not the last string unit (y≠3) (step ST370; no), the process proceeds to step ST380, and where the string unit SUy is the last string unit (y=3) (Step ST370; yes), the process proceeds to step ST390.

In step ST380, the sequencer 170 increments y (y=y+1) (selects the next, string unit SUCy+1) of string unit SUy), and thereafter the process returns to step ST330. Thus, steps ST330 to ST380 are repeatedly executed until string unit SUy is the last string unit. That is, the sequencer 170 confirms that the normal write operation has been executed in all the string units SU of the layer Lx, and then causes the process to proceed to step ST390.

In step ST390, the sequencer 170 determines whether or not layer Lx is the uppermost layer (whether or not x=7). Where layer Lx is not the uppermost layer (x=7) (step ST390; no), the process proceeds to step ST400, and where layer Lx is the uppermost layer (x=7) (step ST390; yes), the process is ended.

In step ST400, the sequencer 170 increments x (x=x+1) (selects layer L that is one layer higher than layer Lx) and selects the first string unit SU as string unit SUy (y=0), and the process returns to step STS30. Thus, steps ST330 to ST400 are repeatedly executed until layer Lx is the uppermost layer. That is, the sequencer 170 confirms that the normal write operation has been executed for ail the layers L of the block. BLK, and then ends the process.

In this manner, the erase operation including the over-erased cell write operation, and the normal write operation are ended.

Next, the order in which the operations shown in FIG. 20 are executed will be described in detail with reference to FIG. 21.

As shown in FIG. 21, in the fourth embodiment, after the "0-0"-th erase operation is executed and before normal write operations "1" to "2" corresponding to the lowermost layer L0 and the first, string unit SU0 are executed, over-erased cell write operation <0-1> corresponding to layer L0 and string unit SU0 are executed. A case assumed to use such an execution order is, for example, a case where the NAND flash memory 100 receives a command related to erase operation <0-0> from the memory controller 200, and only over-erased cell write operation <0-1> is sequentially executed in succession to erase operation <0-0>.

Next, normal write operation <1> for memory cell transistors MCa0(0) is executed.

Then, after normal write operation <2-0> for memory cell transistors MCb0(G) is executed, the next string unit SU1 are selected, and over-erased cell write operations <2-1> corresponding to layer LG and string unit SU1 are executed.

Similarly, at the end of normal write operations for selected string units SUy, over-erased cell write operations for the next string unit SU(y+1) are executed. In addition, at the end of normal write operations for selected layer Lx, over-erased cell write operations for layer L(x+1), which is one layer higher, are executed, 4.2 Advantages of Present Embodiment According to the fourth embodiment, an over-erased cell write operation corresponding to the lowermost layer L0 of block BLK and the first string unit SUG is executed, after an erase operation is executed for the block BLK and before a normal write operation is executed. After the normal write operation corresponding to string unit SUy is executed and before the normal write operation corresponding to string unit SU(y+1) is executed, an over-erased cell write operation corresponding to string unit SU(y+1) is executed. That is, the over-erased cell write operation is divisionally executed for each layer between the erase operation and the normal write operation or between the normal write operation corresponding to string unit SUy and the normal write operation corresponding to string unit SU(y+1). As a result, the execution time of the over-erased cell write operation executed subsequent to the erase operation or the normal write operation can be divided or distributed for each string unit SU. For this reason, the time required for executing the over-erased cell write operation can be distributed within block BLK, and the increase in load can be smoothed.

5. Modifications

The first to fourth embodiments described above can be modified in various manners.

5.1 First Modification

First, a first modification will be described.

In connection with the second to fourth embodiments described above, reference was made to the case where the over-erased cell write operation is executed in advance before the normal write operation is started such that the memory cell transistor MC for the write operation is to be executed does not become an over-erased cell. However, this case is not restrictive.

For example, before the normal write operation is started, the over-erased cell write operation may be executed in advance for higher-layer memory cell transistor MC of the same substring unit SSU in addition to memory cell transistor MC for which the write operation is to foe executed.

According to the first modification, erroneous data write can be suppressed due to over-erased cells existing in a layer higher than the layer for which the write operation is to be executed. Examples of application to some of the embodiments will be shown below.

5.1.1 Application Example to Third Embodiment

First, an example in which the first modification is applied to the third embodiment will be described. In the description below, the configurations and operations similar to those of the third embodiment will not be mentioned, and mainly the configurations and operations different from those of the third embodiment will be mentioned.

Figure 22:
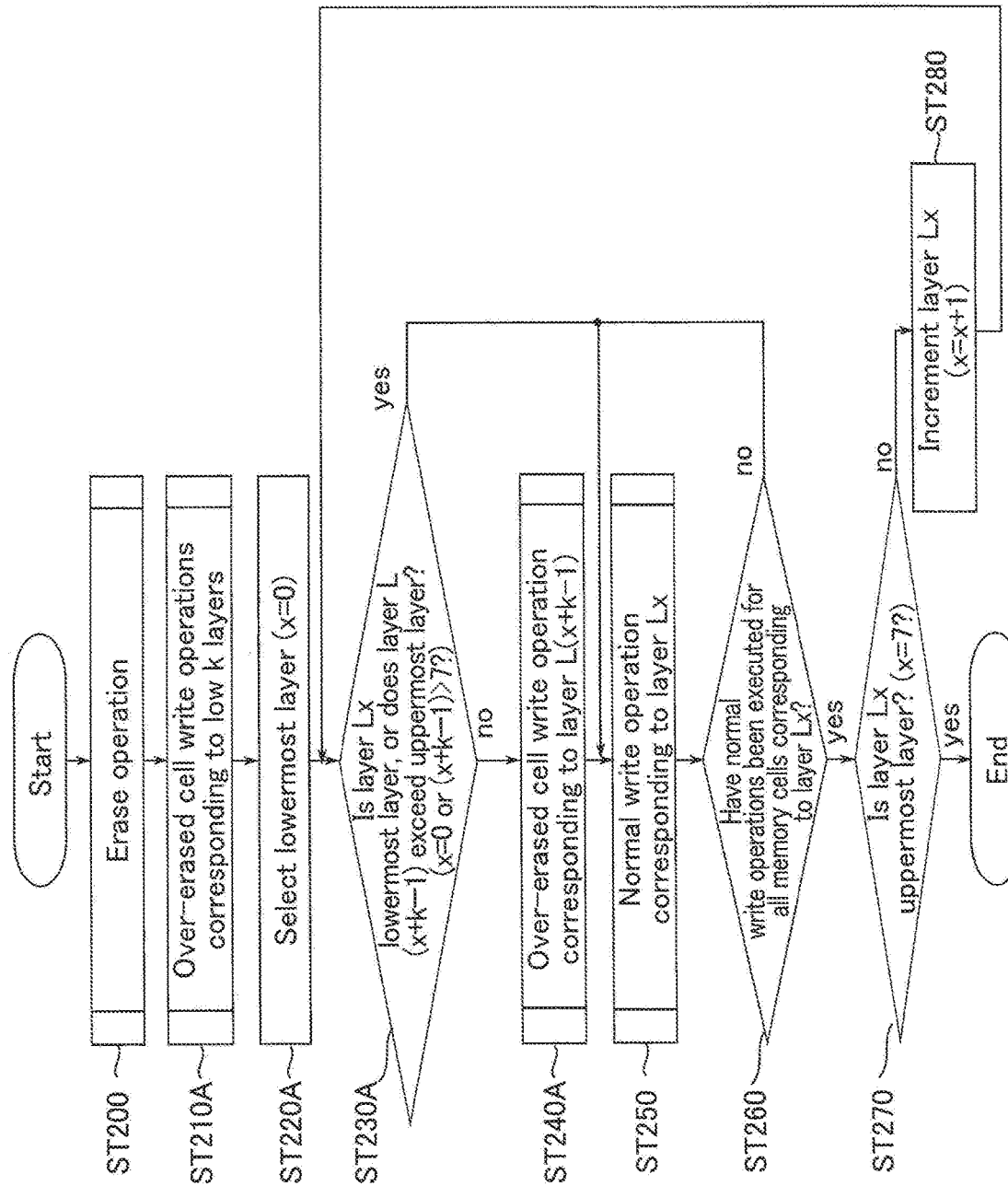
FIG. 22 is a flowchart for illustrating an order in which an over-erased cell, write operation and a normal write operation are executed for a block of a semiconductor memory device according to a first modification applied to the third embodiment.

FIG. 22 is a flowchart for illustrating how a series of operations from the erase operation to the normal write operation are executed in the semiconductor memory device according to the third embodiment to which the first modification is applied. FIG. 22 corresponds to FIG. 18 referred to in connection with the third embodiment. FIG. 23 is a table schematically showing an example of the order in which the over-erased cell write operation and the normal write operation are executed when the series of operations are executed according to FIG. 22. FIG. 22 corresponds to FIG. 19 referred to in connection with the third embodiment.

First, a series of operations from the erase operation to the normal write operation will be described with reference to FIG. 22.

As shown, in FIG. 22, in step ST200, the sequencer 170 executes an erase operation when it receives a command set corresponding to the erase operation from the memory controller 200.

In step ST210A, the sequencer 170 executes an over-erased cell write operations corresponding to low k layers (k layers from the lowermost layer) in succession to the erase operation described in step ST200 (k is an integer of 2 or more).

After steps ST200 and ST210A, the NASID flash memory 100 receives a command set (not shown) corresponding to a normal write operation, for example, from the memory controller 200.

In step ST220A, upon reception of a command set corresponding to the normal write operation from the memory controller 200, the sequencer 170 selects the lowermost layer as layer Lx (x=0) for which the normal write operation is to be executed. Unlike step ST220 shown in FIG. 18 of the third embodiment, layer Lx selected in step ST220A has no relation to the target of a normal write operation executed in step ST240A described later.

In step ST230A, the sequencer 170 determines whether layer Lx is the lowermost layer or whether layer L(x+k−1) exceeds the uppermost layer (whether x=0 or whether (x+k−1)>7). Where layer Lx is not the lowermost layer and layer L(x+k−1) is the uppermost layer or its lower layer (x≠0 and (x+k−1)≤7) (step ST230A; no), the process proceeds to step ST240A. Where layer Lx is the lowermost layer or layer L(x+k−1) exceeds the uppermost layer (x=0 or (x+k−1)>7) (step ST230A; yes), the process proceeds to step 3T250, skipping step ST240A.

In step ST240A, the sequencer 170 executes an over-erased cell write operation corresponding to layer L(x+k−1).

Subsequent steps ST25G to ST280 are similar to ST250 to ST280 of FIG. 18 referred to in connection with the third embodiment, and thus a description thereof will be omitted.

In this manner, the erase operation including the over-erased cell write operation, and the normal write operation are ended.

Next, the order in which the operations shown in FIG. 22 are executed will be described in detail with reference to FIG. 23. In FIG. 23, a case of k=2 is shown for convenience of description.

As shown in FIG. 23, in the third embodiment to which the first modification is applied, after the "0–0"-th erase operation is executed and before normal write operations <1> to <7> and <8–0> corresponding to the lowermost layer L0 are executed, over-erased cell write operations <0–1> to <0–4> and <0–5> to <0–8> corresponding to layers L0 and L1, which are two lowermost layers, are executed.

When the execution of operation <8–0> for the last substring unit SSU, which is the last one of the normal write operations corresponding to layer LC, is completed, over-erased cell write operations <8–1> to <8–4> corresponding to layer L2 are executed before the first normal write operation <9> corresponding to layer L1 is executed. As a result, the number of over-erased cells in layer L1 for which the normal write operation is executed next and the number of over-erased cells in layer L2 which is one layer higher can be reduced to a negligible level.

Similarly, when the normal write operation for layer Lx is completed, an over-erased cell write operation is executed for layer L(x+2) which is one layer higher than L(x+1).

5.1.2 Application Example to Fourth Embodiment

Next, an example in which the first modification is applied to the fourth embodiment will be described. In the description below, the configurations and operations similar to those of the fourth embodiment will not foe mentioned, and mainly the configurations and operations different from those of the fourth embodiment will be mentioned.

Figure 24:
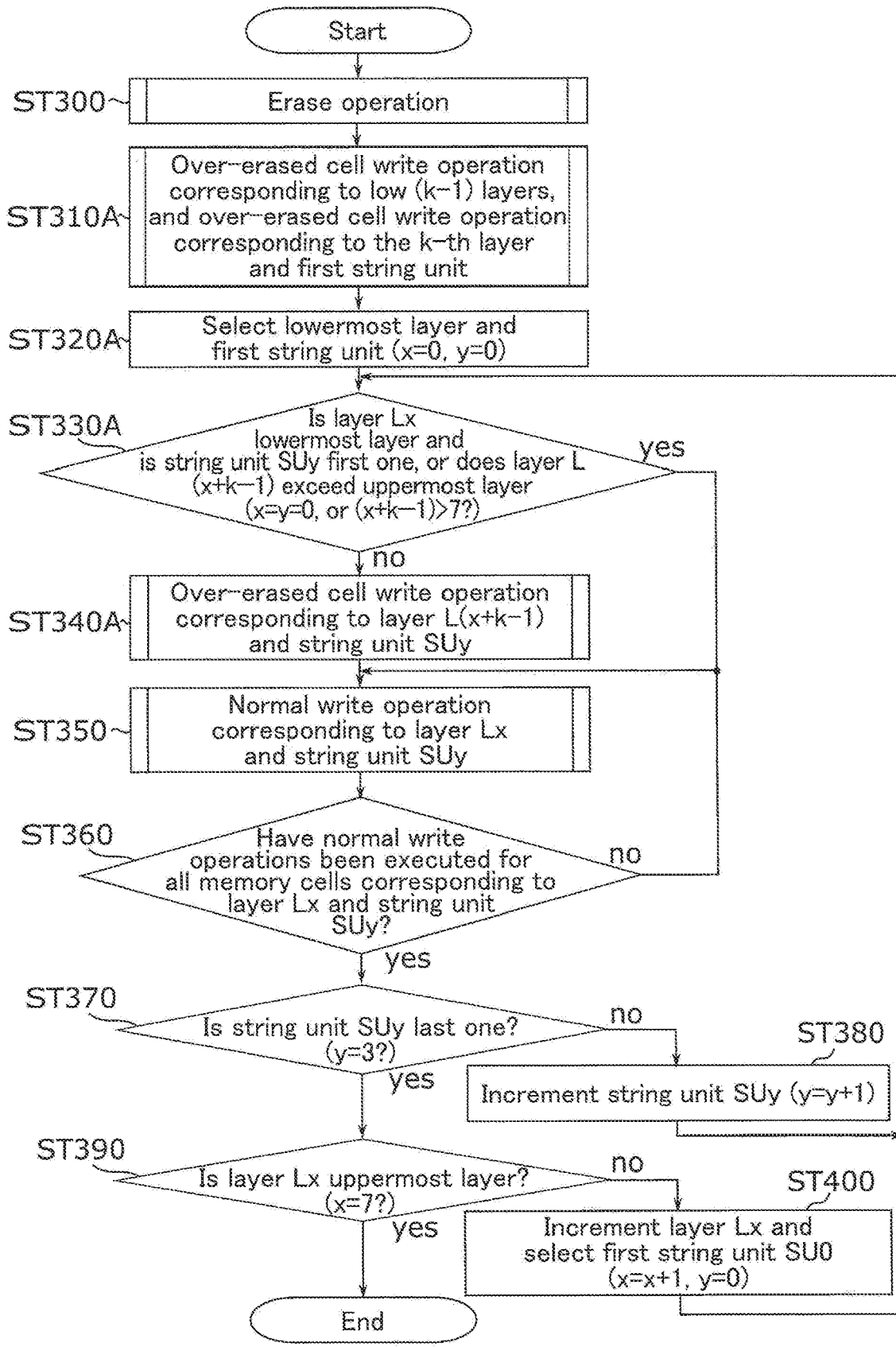
FIG. 24 is a flowchart for illustrating an order in which an over-erased cell write operation and a normal write operation are executed for a block of a semiconductor memory device according to a first modification applied to the fourth embodiment.

FIG. 24 is a flowchart for illustrating how a series of operations from the erase operation to the normal write operation are executed in the semiconductor memory device according to the fourth embodiment to which the first modification is applied. FIG. 24 corresponds to FIG. 20 referred to in connection with the fourth embodiment. FIG. 25 is a table schematically showing an example of the order in which the over-erased cell write operation and the normal write operation are executed when the series of operations are executed according to FIG. 24. FIG. 25 corresponds to FIG. 21 referred to in connection with the fourth embodiment.

First, a series of operations from the erase operation to the normal write operation will be described with reference to FIG. 24.

As shown, in FIG. 24, in step ST300, the sequencer 170 executes an erase operation when it receives a command set corresponding to the erase operation from the memory controller 200.

In step ST310A, sequencer 170 executes an over-erased cell write operation corresponding to low (k−1) layers ((k−1) layers from the lowermost layer) and an over-erased cell write operation corresponding to the kth layer from the lowermost layer and the first string unit SU in succession to the erase operation described in step ST300 (k is an integer of 2 or more).

After steps STS00 and ST310A, the NAND flash memory 100 receives a command set. (not shown) corresponding to a normal write operation, for example, from the memory controller 200.

In step ST320A, upon reception of a command set corresponding to the normal write operation from the memory controller 200, the sequencer selects the lowermost layer and the first string unit SU as layer Lx and string unit SUy (x=0, y=0) for which the normal write operation is to be executed. Unlike step ST320 in FIG. 20 of the fourth embodiment, layer Lx and string unit which are selected in step ST320A, especially layer Lx, have no relation to the target, of an over-erased cell write operation executed in step ST340A described later.

In step ST330A, the sequencer 170 determines whether layer Lx is the lowermost layer and string unit SUy is the first string unit, or whether layer L(x+k−1) exceeds the uppermost layer (whether x=y=0, or whether (x+k−1)>7). Where layer Lx is not the lowermost layer or string unit SUy is not the first string unit, and layer (x+k−1) is the uppermost layer or its lower layer (x≠0 or y≠0, and (x+x−1)≤7) (step ST33GA; no), the process proceeds to step ST340A. Where layer Lx is the lowermost layer and string unit SUy is the first string unit, or layer L(x+k−1) exceeds the uppermost layer (x=y=0 or (x+k−1)>7) (step ST330A; yes), the process proceeds to step ST350, skipping step ST340A.

In step ST340A, the sequencer 170 executes an over-erased cell write operation corresponding to layer L(x+k−1) and string unit SUy.

Subsequent steps STS50 to ST400 are similar to ST350 to ST380 of FIG. 20 referred to in connection with the fourth embodiment, and thus a description thereof will be omitted.

In this manner, the erase operation including the over-erased cell write operation, and the normal write operation are ended.

Next, the order in which the operations shown in FIG. 24 are executed will be described in detail with reference to FIG. 25. In FIG. 25, the case of k=2 is shown for convenience of description.

As shown in FIG. 25, in the fourth embodiment to which the first modification is applied, after the "0–0"-th erase operation is executed and before normal write operations <1> and <2-0> corresponding to the lowermost layer L0 and the first string unit SU0 are executed, over-erased cell write operations <0-1> to <0-4> corresponding to layer L0, which is the lowermost layer, and over-erased cell write operation <0-5> corresponding to layer L1, which is the second layer, and the first, string unit SU0 are executed.

After normal write operations <1> and <2-0> corresponding to string unit SUy are completed and before normal write operations <3> and <4-0> corresponding to layer L0 and string unit SU1 are executed, over-erased cell write operation <2-1> corresponding to layer L1 and string unit SU1 is executed. As a result, the number of over-erased cells existing in layer L0 and layer L1, which is one layer higher, can be reduced to a negligible level with respect to string unit SU1 for which the normal write operation is to be executed next.

Subsequently, at the end of normal write operations for layer Lx and string units SUy, over-erased cell write operations for layer L(x+1) and string unit SU(y) are executed in a similar manner. When the normal write operation is completed for all the string units SU in layer Lx, an over-erased cell write operation is executed for layer L(x+2), which is one layer higher than layer L(x+1) and for which a normal write operation Is to be executed, and string unit SU0.

5.2 Second Modification

In connection with the second to fourth embodiments described above, reference was made to the case where an over-erased cell write operation is executed in units of pair cells, but this is not restrictive. For example, in the second modification, the over-erased cell write operation can be executed in units of layer L.

That is, in the second to fourth embodiments described above, it is determined by the over-erased cell verify operation whether or not at least one of the pair cells (sets of two memory cell transistors MC) corresponding to layer Lx and string unit SUy is an over-erased cell. Also, the threshold voltages of two memory cell transistors MC in the pair cell of which at least one is determined to be an over-erased cell are simultaneously increased. In contrast, in a second modification, it is determined by the over-erased cell verify operation whether or not at least one of four pair cells (eight memoir, cell transistors MC) corresponding to layer Lx and string unit SU0 to SU3 is an over-erased cell. Also, the threshold voltages of eight memory cell transistors MC in the four pair cells of which at least one is determined to be an over-erased cell are simultaneously increased.

According to the second modification, over-erased cell write operations that are individually executed for respective string units SU with respect to one layer b can be combined as an operation executed at a time. Thereby, an increase in load due to execution of the over-erased cell write operations can be reduced.

In the second modification, the number of memory cell transistors MC whose threshold voltages are increased by one-time over-erased cell program operation increases from 2 to 3, so that it is presumed that the number of cells that may cause erroneous read increases. For this reason, in the second modification, it is desirable that the cells that may cause erroneous read be suppressed to such a degree that errors are correctable by an error correction operation.

Examples of application to some of the embodiments will be shown below.

5.2.1 Application Example to Second Embodiment

First, an example in which the second modification is applied to the second embodiment will be described. In the description below, the configurations and operations similar to those of the second embodiment will not be mentioned, and mainly the configurations and operations different from those of the second embodiment will be mentioned.

FIG. 26 is a table schematically showing an example of the order in which the over-erased cell write operation and the normal write operation are executed in the semiconductor memory device according to the second embodiment to which the second modification is applied. FIG. 26 corresponds to FIG. 17 referred to in connection with the second embodiment.

As shown in FIG. 26, erase operation <0-0> is first executed, and then over-erased cell write operations <0-1> to <0-8> are executed before normal write operations <1> to <64> are executed.

Specifically, layer L0 is first selected as the lowermost layer, and over-erased cell write operations <0-1> are simultaneously executed for four pair cells (MCa0(0) and MCb0(0)) to (MCa0(3) and MCb0(3)) respectively corresponding to string units SU0 to SU3.

Next, layer L1 that is one layer higher than layer L0 is selected, and as in the case of layer L0, over-erased cell write operations <0-2> are executed for four pair cells (MCa1(0) andMCb1(O)) to (MCa1(3) and MCb1(3)) respectively corresponding to string units SU0 to SU3. Similarly, over-erased cell write operations <0-3> to <0-8> are executed in the order of layers L2 to L7.

After the over-erased cell write operations for all the layers L0 to L7 are completed, normal write operations <1> to <64> are executed.

5.2.2 Application Example to Third Embodiment

Next, an example in which the second modification is applied to the third embodiment will be described. In the description below, the configurations and operations similar to those of the third embodiment will not be mentioned, and mainly the configurations and operations different from those of the third embodiment will be mentioned.

FIG. 27 is a table schematically showing an example of the order in which the over-erased cell write operation and the normal write operation are executed in the semiconductor memory device according to the third embodiment to which the second modification is applied. FIG. 27 corresponds to FIG. 15 referred to in connection with the third embodiment.

As shown in FIG. 27, after the "0-0"-th erase operation is executed and before normal write operations <1> to <7> and <8-0> corresponding to the lowermost layer L0 are executed, over-erased cell write operation <0-1> is executed for four pair cells (MCa0(0) and MCb0(0)) to (MCa0(3) and MCb0(3)) respectively corresponding to string units SU0-SU3.

Next, normal writs operations <1> to <7> for memory cell transistors MCa0(0), MCb0(0), MCb0(1), MCa0(1), MCa0(2), MCb0(2) and MCb0(3) are executed in this order.

Then, after normal write operation <8-0> for memory cell transistor MCa0(3) is executed, layer L1 that is one layer higher than layer L0 is selected, and over-erased cell write operation <8-1> for four pair cells (MCa1(0) and MCb1(0)) to (MCa1(3) and MCb1(3)) respectively corresponding to string units SU0 to SU3 are executed.

Subsequently, at the end of normal write operation for selected layer Lx, the over-erased cell write operation for layer L(x+1), which is one layer higher, are executed in a similar manner.

5.3 Third Modification

In connection with the first to fourth embodiments described above, reference was made to the case where voltage Vnnvfy is simultaneously applied to word lines WLa and WLb coupled to target pair cells MCa and MCb in the over-erased cell verify operation. However, this is not restrictive.

For example, in the over-erased cell verify operation, the operation of applying voltage Vnnvfy to word line WLa and simultaneously applying a voltage different from voltage Vnnvfy to word line WLb and the operation of applying voltage Vnnvfy to word line WLb and simultaneously applying a voltage different from Vnnvfy to word line WLa may be executed individually.

In the description below, the configurations and operations similar to those of the first embodiment will not be mentioned, and mainly the configurations and operations different from those of the first embodiment will be mentioned.

FIG. 28 is a schematic diagram for illustrating how an over-erased cell verify operation is executed in a semiconductor memory device according to the third modification. FIG. 28 corresponds to FIG. 12 referred to in connection with the first embodiment.

As shown in FIG. 28, in the over-erased cell verify operation, the row decoder 120 executes a two-stage operation. Specifically, as shown in FIG. 28A, in the first-stage operation, the row decoder 120 applies voltage Vnnvfy to word line WLa3 corresponding to one memory cell transistor MCa3 of pair cell MCa3 and MCb3, applies voltage VREAD to word lines WLa0 to WLa2 and WLa4 to WLa7, and applies voltage Vnn to word lines WLb0 to WLb7. In this state, the sense amplifier 140 determines whether or not a current flows through the memory pillar MP.

Also, as shown in FIG. 28B, in the second-stage operation, the row decoder 120 applies voltage Vnnvfy to word line WLb3 corresponding to one memory cell transistor MCb3 of pair cell MCa3 and MCb3, applies voltage VREAD to word lines WLb0 to WLb2 and WLb4 to WLb7, and applies voltage Vnn to word lines WLa0 to WLa7. In this state, the sense amplifier 140 determines whether or not a current flows through the memory pillar MP.

Where the threshold voltages of pair cell MCa3 and MCb3 are both equal to or higher than voltage Vnnvfy, no current flows through the memory pillar MP in either of the first-stage and second-stage operations. On the other hand, where at least one of the threshold voltages of pair cell MCa3 and MCb3 is lower than voltage Vnnvfy, a current flows through the memory pillar MP in one of the first-stage and second-stage operations. As in the case shown in FIG. 12, in the over-erased cell verify operation shown in FIG. 28, a determination can be made as to whether neither of pair cells MCa3 and MCb3 is an over-erased cell or at least one of them is an over-erased cell.

According to the third modification, the voltages applied to word lines WLa and WLb in the over-erased cell verify operation can be set in the same manner as the verify operation of the normal write operation. That is, the voltage configuration shown in FIG. 28A is similar to that of the verify operation (FIG. 11) of the normal write operation executed with respect to memory cell transistor MCa3, except that the voltage applied to word line WLa3 is Vnnvfy. The voltage configuration shown in FIG. 28B is similar to that of the verify operation of the normal write operation executed with respect to memory cell transistor MCb3, except that the voltage applied to word line WL3b is Vnnvfy. For this reason, in the over-erased cell verify operation, the conditions regarding target pair cell MCa and MCb can be made similar to those of the normal write operation, and deterioration of the determination accuracy of the over-erased cell verify operation can be suppressed.

5.4 Others

In connection with the second to fourth embodiments described above, reference was made to the case where the normal write operation starts from the lowermost layer and is executed up to the uppermost layer, but this is not restrictive. For example, the normal write operation may be ended when it is executed up to a predetermined intermediate layer (further, up to a given string unit of the intermediate layer). In this case, for example, in step ST130 shown in FIG. 16, the sequencer 170 may determine whether or not layer Lx is the predetermined intermediate layer.

Further, for example, where a further normal write operation is executed for block BLK for which a write operation has already executed to the predetermined layer (the predetermined string unit thereof), the sequencer 170 may select, for example in step ST110 shown in FIG. 16, a layer next to the predetermined layer for which the write operation has been completed (or a string unit next to the predetermined string unit for which the write operation has been completed).

Even where the write operation is executed up to the intermediate layer, or where a further write operation is executed from the intermediate layer, the over-erased cell write operation may be executed in combination with the operations, as in the second embodiment to the fourth embodiment described above.

In connection with the second to fourth embodiments described above, reference was made to the case where layer L0 is selected as the lowermost layer to execute the over-erased cell write operation after the erase operation, but this is not restrictive. For example, where a dummy word line is provided between the lowermost word line WL and select gate line SGS, a layer (not shown) including the dummy word line may be selected in place of layer L0 and used as the lowermost layer.

In connection with the first to fourth embodiments, reference was made to the case where the charge storage layers 33 contain polysilicon or a metal material, but this is not restrictive. For example, the charge storage layers 33 may contain an insulating material such as silicon nitride (SiN), In this case, charge storage layers 33a and 33b function as charge trap type charge storage layers, so that they do not have to be separate and may be integrally formed.

In connection with the second modification described above, reference was made to the case where the over-erased cell write operations corresponding to one layer L are combined and executed as a one-time operation, but this is not restrictive. For example, the over-erased cell write operations corresponding to the set of string units SU0 and SU1 of one layer L and the over-erased cell write operations corresponding to the set of string units SU2 and SU3 of that layer L may be combined and executed as one-time operations, respectively. Needless to say, it is possible to arbitrarily determine how many string units 3U should be combined to execute the over-erased cell erase operation for one layer h, and which string units SU should be selected to execute the erase over-erased cell write operation.

While certain embodiments have been described, these embodiments have been presented by way of: example only, and are not intended to limit the scope of the inventions. Indeed, the embodiments described herein may be embodied in a variety of other forms; furthermore, various omissions, substitutions and changes in the form of the embodiments described herein, may be made without departing from the spirit of the inventions. The accompanying claims and their equivalents are intended to cover such forms or modifications as would fall within the scope and spirit.

What is claimed is:

1. A semiconductor memory device comprising:
a first memory cell and a second memory cell capable of storing data and coupled in parallel to a bit line;
a first word line coupled to the first memory cell;
a second word line coupled to the second memory cell and being different from the first word line;
an insulator disposed between the first word line and the second word line;
a control circuit,
a third memory cell and a fourth memory cell capable of storing data and coupled in parallel to the bit line;
a third word line coupled to the third memory cell; and
a fourth word line coupled to the fourth memory cell,
wherein:
the first word line and the second word line are insulated from each other by the insulator;
the first memory cell and the second memory cell share a first well region and are opposed to each other, with the first well region interposed;
the first memory cell, the second memory cell, the third memory cell and the fourth memory cell share the first well region;
the first memory cell and the third memory cell are opposed to the second memory cell and the fourth memory cell, with the first well region interposed;
in a first operation, the control circuit is configured to:
repeat application of a first voltage to the first word line and the second word line a plurality of times while increasing the first voltage,
apply a second voltage to the first word line and the second word line and determine whether both the first memory cell and the second memory cell are in a first state, and
repeat the applying of the second voltage, the determining, and the applying of the first voltage the plurality of times while increasing the first voltage, until both the first memory cell and the second memory cell are determined to be in the first state; and
the control circuit is further configured to:
execute the first operation after a second operation in which data stored in the first memory cell and the second memory cell are erased, and
execute the first operation after the second operation and before a third operation in which a data item is written to the first memory cell and a fourth operation in which a data item is written to the second memory cell;
in a fifth operation, the control circuit is configured to:
apply the second voltage to the third word line and the fourth word line and determine whether both the third memory cell and the fourth memory cell are in the first state, and
repeat the applying of the second voltage to the third word line and the fourth word line, the determining, and applying the first voltage to the third word line and the fourth word line a plurality of times while increasing the first voltage, until both the third memory cell and the fourth memory cell are determined to be in the first state; and
the control circuit is further configured to:
erase data stored in the third memory cell and the fourth memory cell in the second operation; and
execute the fifth operation after the second operation and before a sixth operation in which a data item is written to the third memory cell and a seventh operation in which a data item is written to the fourth memory cell.

2. The device of claim 1, wherein:
the third word line and the fourth word line are positioned above the first word line and the second word line, and
the control circuit is further configured to execute the fifth operation after the third operation and the fourth operation.

3. The device of claim 1, wherein:
the third word line and the fourth word line are positioned above the first word line and the second word line, and
the control circuit is further configured to execute the fifth operation before the third operation and the fourth operation.

4. A semiconductor memory device comprising:
a first memory cell and a second memory cell capable of storing data and coupled in parallel to a bit line;
a first word line coupled to the first memory cell;
a second word line coupled to the second memory cell and being different from the first word line;
an insulator disposed between the first word line and the second word line;
a control circuit; and
a fifth memory cell and a sixth memory cell capable of storing data and coupled in parallel to the bit line,
wherein:
the first word line and the second word line are insulated from each other by the insulator;
the first memory cell and the second memory cell share a first well region and are opposed to each other, with the first well region interposed;
the fifth memory cell is coupled to the first word line,
the sixth memory cell is coupled to the second word line,
the fifth memory cell and the sixth memory cell share a second well region and are opposed to each other, with the second well region interposed,
in a first operation, the control circuit is configured to:
repeat application of a first voltage to the first word line and the second word line a plurality of times while increasing the first voltage,
apply a second voltage to the first word line and the second word line and determine whether both the first memory cell and the second memory cell are in a first state, and
repeat the applying of the second voltage, the determining, and the applying of the first voltage the plurality of times while increasing the first voltage, until both the first memory cell and the second memory cell are determined to be in the first state; and
the control circuit is further configured to:
execute the first operation after a second operation in which data stored in the first memory cell and the second memory cell are erased,
execute the first operation after the second operation and before a third operation in which a data item is written to the first memory cell and a fourth operation in which a data item is written to the second memory cell; and in an eighth operation, the control circuit is further configured to:
apply the second voltage to the first word line and the second word line and determine whether both the fifth memory cell and the sixth memory cell are in the first state regardless of whether or not the first memory cell and the second memory cell are in the first state, and
repeat the applying of the second voltage, the determining, and the applying of the first voltage the plurality of times while increasing the first voltage, until the fifth memory cell and the sixth memory cell are determined to be in the first state.

5. The device of claim 4, wherein the control circuit is further configured to:
erase data stored in the fifth memory cell and the sixth memory cell in the second operation, and
execute the eighth operation after the second operation and before a ninth operation in which a data item is written to the fifth memory cell and a tenth operation in which a data item is written to the sixth memory cell.

6. The device of claim 5, wherein the control circuit is further configured to execute the eighth operation before the third operation and the fourth operation and subsequently to the first operation.

7. The device of claim 5, wherein the control circuit is further configured to execute the eighth operation after the third operation and the fourth operation.

8. The device of claim 5, further comprising:
a seventh memory cell and an eighth memory cell capable of storing data and coupled in parallel to the bit line;
a third word line coupled to the seventh memory cell; and
a fourth word line coupled to the eighth memory cell, wherein:
the fifth memory cell, the sixth memory cell, the seventh memory cell and the eighth memory cell share the second well region,
the fifth memory cell and the seventh memory cell are opposed to the sixth memory cell and the eighth memory cell, with the second well region interposed, and
in an eleventh operation, the control circuit is further configured to:
apply the second voltage to the third word line and the fourth word line and determine whether both the seventh memory cell and the eighth memory cell are in the first state; and
repeat the applying of the second voltage to the third word line and the fourth word line, the determining, and applying the first voltage to the third word line and the fourth word line a plurality of times while increasing the first voltage, until both the seventh memory cell and the eighth memory cell are determined to be in the first state.

9. The device of claim 8, wherein the control circuit is further configured to:
erase data stored in the seventh memory cell and the eighth memory cell in the second operation, and
execute the eleventh operation after the second operation and before a twelfth operation in which a data item is written to the seventh memory cell and a thirteenth operation in which a data item is written to the eighth memory cell.

10. The device of claim 9, wherein:
the third word line and the fourth word line are positioned above the first word line and the second word line, and
the control circuit is further configured to execute the eleventh operation before the ninth operation and the tenth operation and after the third operation and the fourth operation.

11. A semiconductor memory device comprising:
a first memory cell and a second memory cell capable of storing data and coupled in parallel to a bit line;
a first word line coupled to the first memory cell;
a second word line coupled to the second memory cell and being different from the first word line;
an insulator disposed between the first word line and the second word line;
a control circuit; and
a fifth memory cell and a sixth memory cell capable of storing data and coupled in parallel to the bit line, wherein:
the first word line and the second word line are insulated from each other by the insulator,
the first memory cell and the second memory cell share a first well region and are opposed to each other, with the first well region interposed,
the fifth memory cell is coupled to the first word line,
the sixth memory cell is coupled to the second word line,
the fifth memory cell and the sixth memory cell share a second well region and are opposed to each other, with the second well region interposed,
in the first operation, the control circuit is configured to:
repeat application of a first voltage to the first word line and the second word line a plurality of times while increasing the first voltage;
apply a second voltage to the first word line and the second word line and determine whether each of the first memory cell, the second memory cell, the fifth memory cell and the sixth memory cell are in a first state; and
repeat the applying of the second voltage, the determining, and applying of the first voltage the plurality of times while increasing the first voltage, until the first memory cell, the second memory cell, the fifth memory cell and the sixth memory cell are determined to be in the first state.

* * * * *